United States Patent
Kühnelt et al.

(10) Patent No.: US 7,860,144 B2
(45) Date of Patent: Dec. 28, 2010

(54) SEMICONDUCTOR LASER COMPONENT, OPTICAL DEVICE FOR A SEMICONDUCTOR LASER COMPONENT, AND METHOD FOR PRODUCING AN OPTICAL DEVICE

(75) Inventors: Michael Kühnelt, Regensburg (DE); Thomas Schwarz, Regensburg (DE); Frank Singer, Regenstauf (DE); Ulrich Steegmüller, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 561 days.

(21) Appl. No.: 11/659,065

(22) PCT Filed: Jun. 24, 2005

(86) PCT No.: PCT/DE2005/001122

§ 371 (c)(1),
(2), (4) Date: Feb. 4, 2008

(87) PCT Pub. No.: WO2006/012819

PCT Pub. Date: Feb. 9, 2006

(65) Prior Publication Data

US 2009/0225797 A1 Sep. 10, 2009

(30) Foreign Application Priority Data

Jul. 30, 2004 (DE) .................. 10 2004 037 019
Oct. 14, 2004 (DE) .................. 10 2004 050 118

(51) Int. Cl.
*H01S 3/08* (2006.01)

(52) U.S. Cl. .................... 372/100; 372/70; 372/99

(58) Field of Classification Search ............... 372/70, 372/99, 100
See application file for complete search history.

(56) References Cited

U.S. PATENT DOCUMENTS 5,341,388 A * 8/1994 Masuda et al. ............. 372/36

(Continued)

FOREIGN PATENT DOCUMENTS

CN 1309827 8/2001

(Continued)

OTHER PUBLICATIONS

Corazza et al., "Wideband Four Channel Optical Transmitter Package using Vertical Cavity Surface Emitting Laser Arrays", Proceedings of the SPIE, vol. 3005, No. 12, pp. 354-359, Feb. 1977.

*Primary Examiner*—Dung T Nguyen
(74) *Attorney, Agent, or Firm*—Cohen Pontani Lieberman & Pavane LLP

(57) ABSTRACT

A semiconductor laser component comprising a semiconductor laser chip (1) provided for generating radiation and an optical device comprising a carrier (7), a radiation deflecting element (8) arranged on the carrier and a mirror arranged on the carrier is proposed, wherein the mirror is formed as an external mirror (9) of an external optical resonator for the semiconductor laser chip (1), the radiation deflecting element is arranged within the resonator, the radiation deflecting element is formed for deflecting at least a portion of a radiation (13, 160) that is generated by the semiconductor laser chip (1) and reflected by the external mirror, the carrier has a lateral main extension direction, and the semiconductor laser chip (1) is disposed downstream of the carrier in a vertical direction with respect to the lateral main extension direction.

36 Claims, 13 Drawing Sheets

U.S. PATENT DOCUMENTS

| | | |
|---|---|---|
| 6,002,695 A | 12/1999 | Alfrey et al. |
| 6,101,210 A | 8/2000 | Bestwick et al. |
| 6,711,203 B1 | 3/2004 | Garnache et al. |
| 2003/0123495 A1 | 7/2003 | Cox |
| 2004/0022286 A1 | 2/2004 | Spath et al. |
| 2004/0136414 A1* | 7/2004 | Matsumoto et al. ........... 372/20 |
| 2005/0259700 A1* | 11/2005 | Spath et al. .................... 372/22 |

FOREIGN PATENT DOCUMENTS

| | | | |
|---|---|---|---|
| DE | 195 36 880 A1 | | 3/1997 |
| DE | 199 29 878 A1 | | 1/2001 |
| DE | 102 41 192 A1 | | 3/2004 |
| DE | 102 53 907 A1 | | 4/2004 |
| EP | 1 096 307 A | | 5/2001 |
| GB | 2 353 405 A | | 2/2001 |
| WO | WO 97/09759 | | 3/1997 |
| WO | WO 97/22166 | * | 6/1997 |
| WO | WO 97/22166 A | | 6/1997 |

* cited by examiner

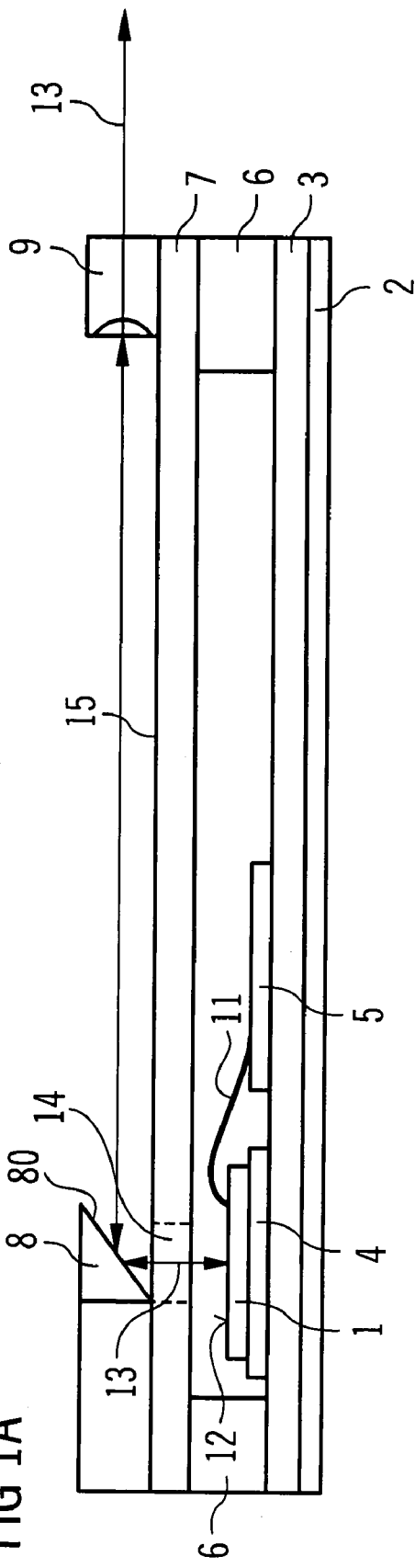

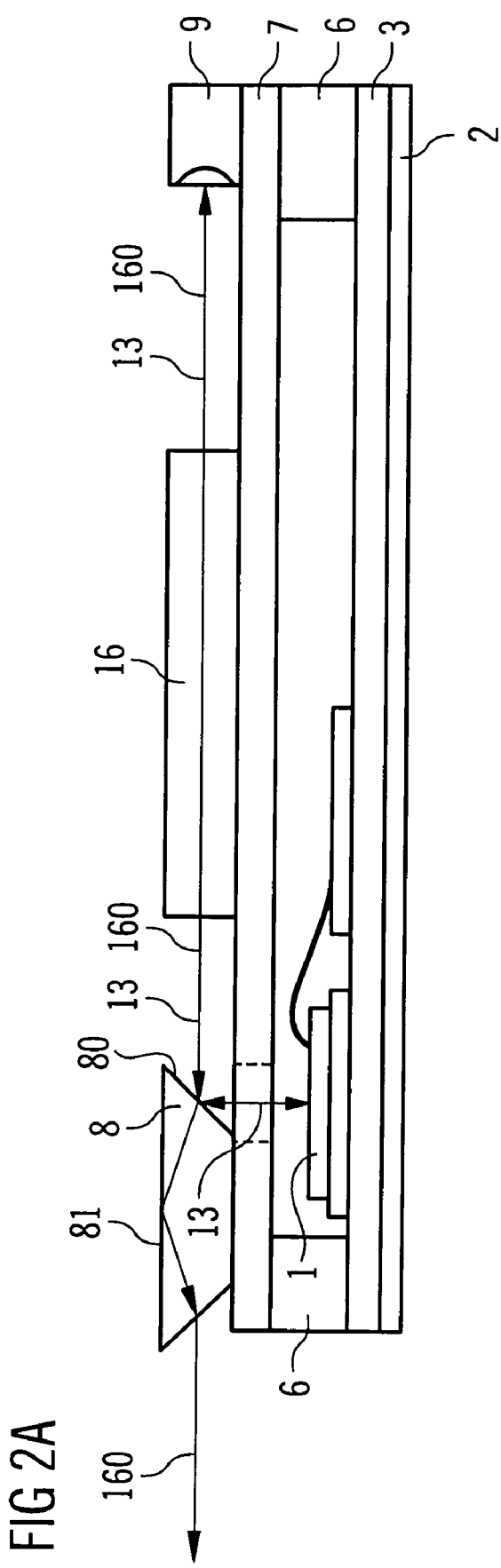
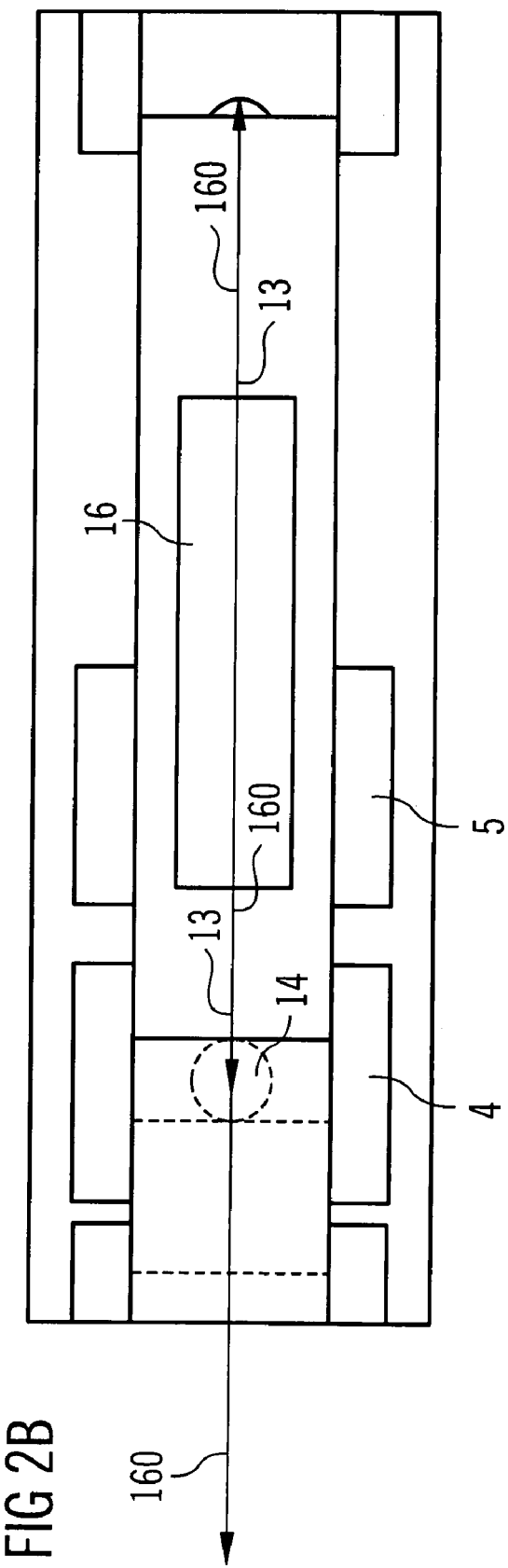
FIG 2A
FIG 2B

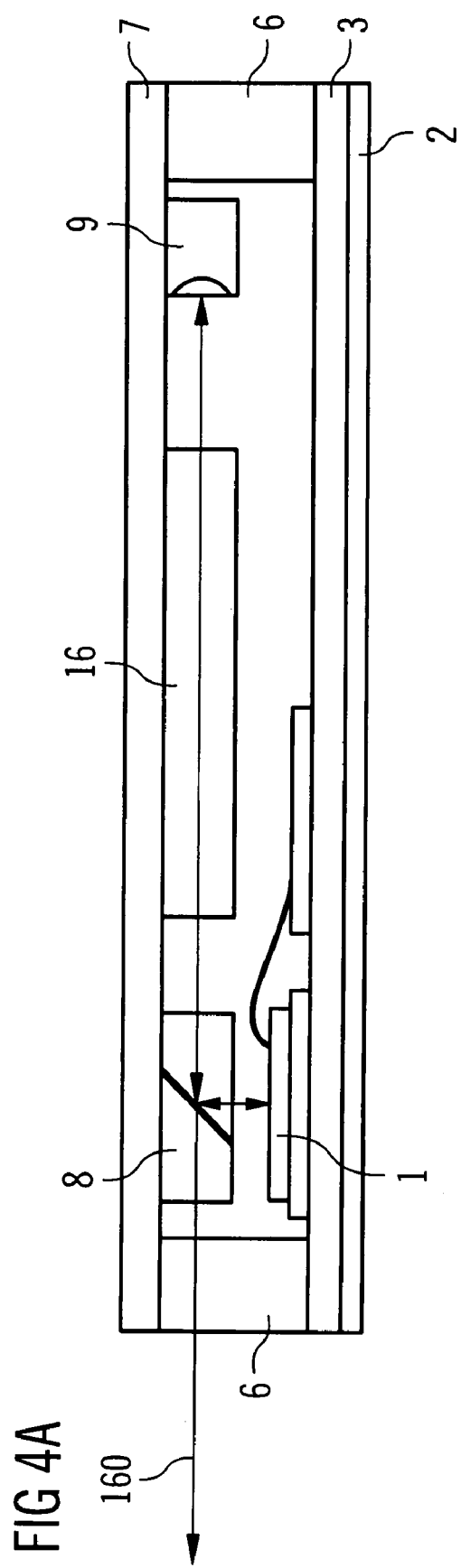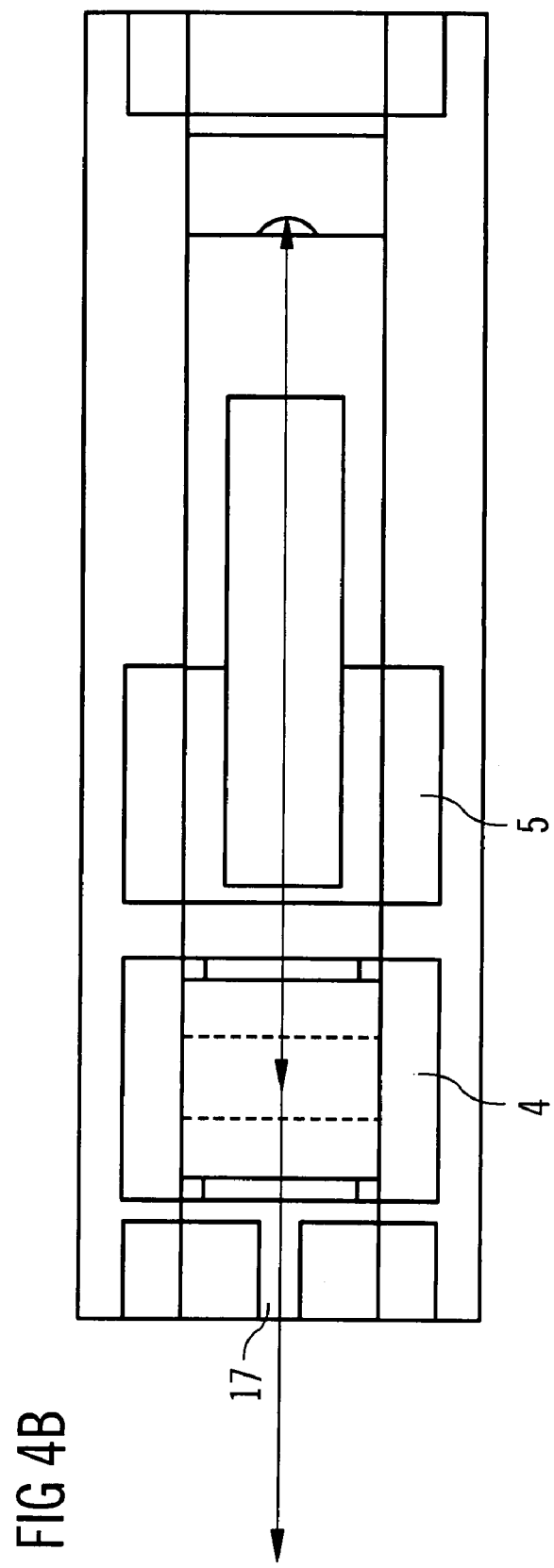

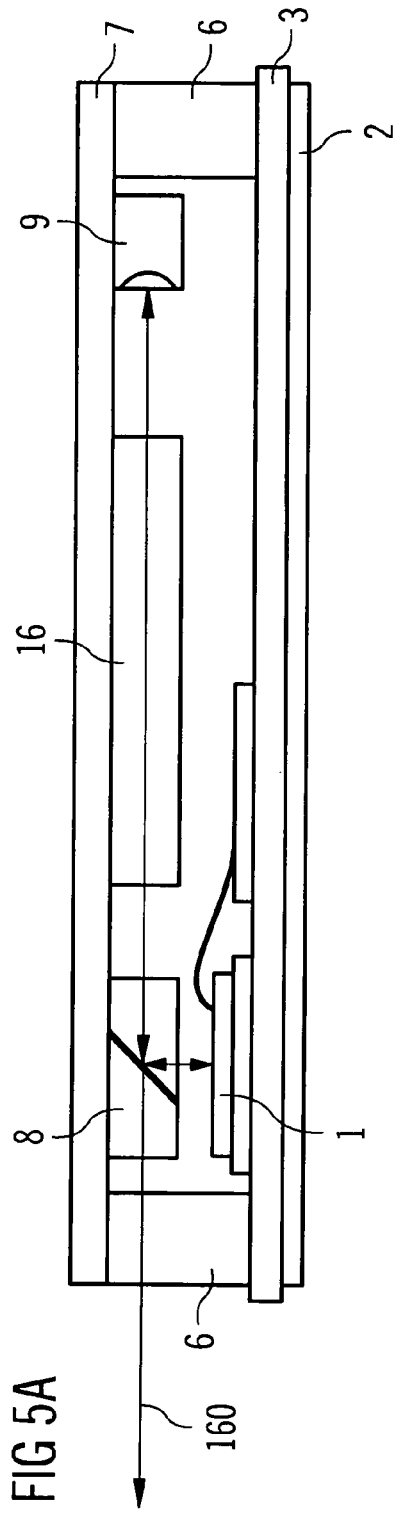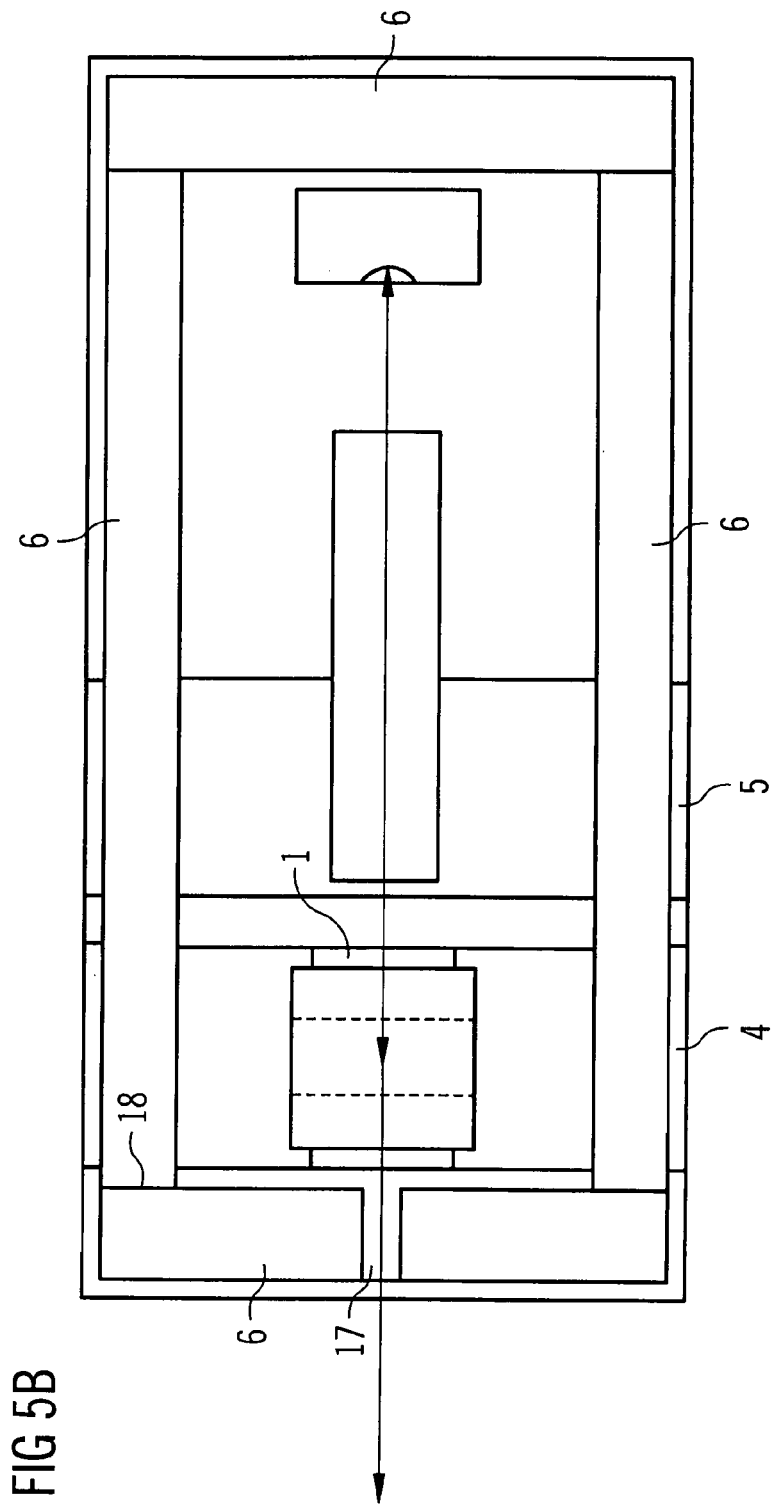

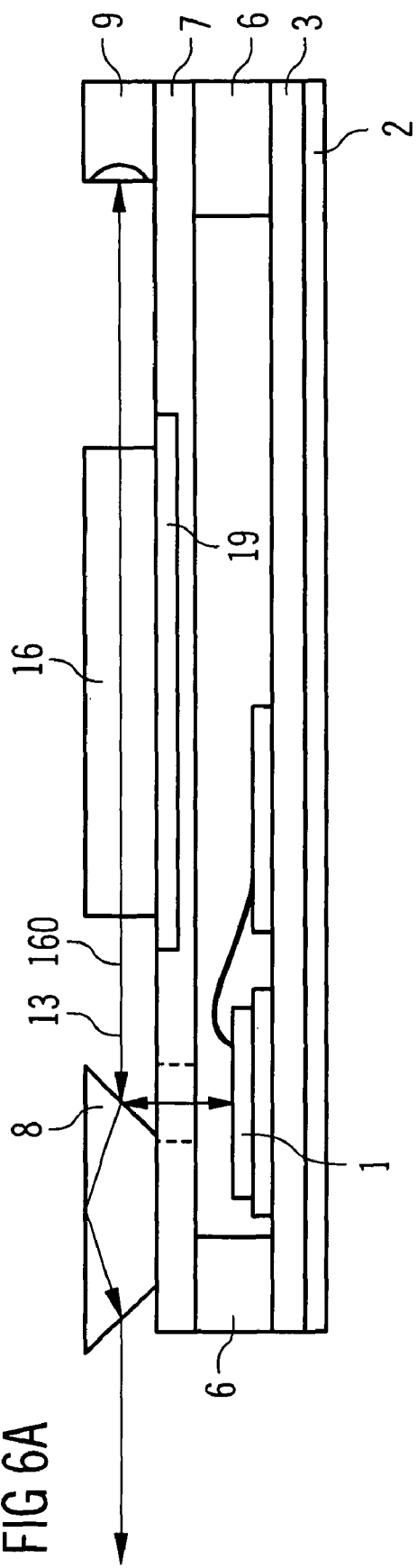
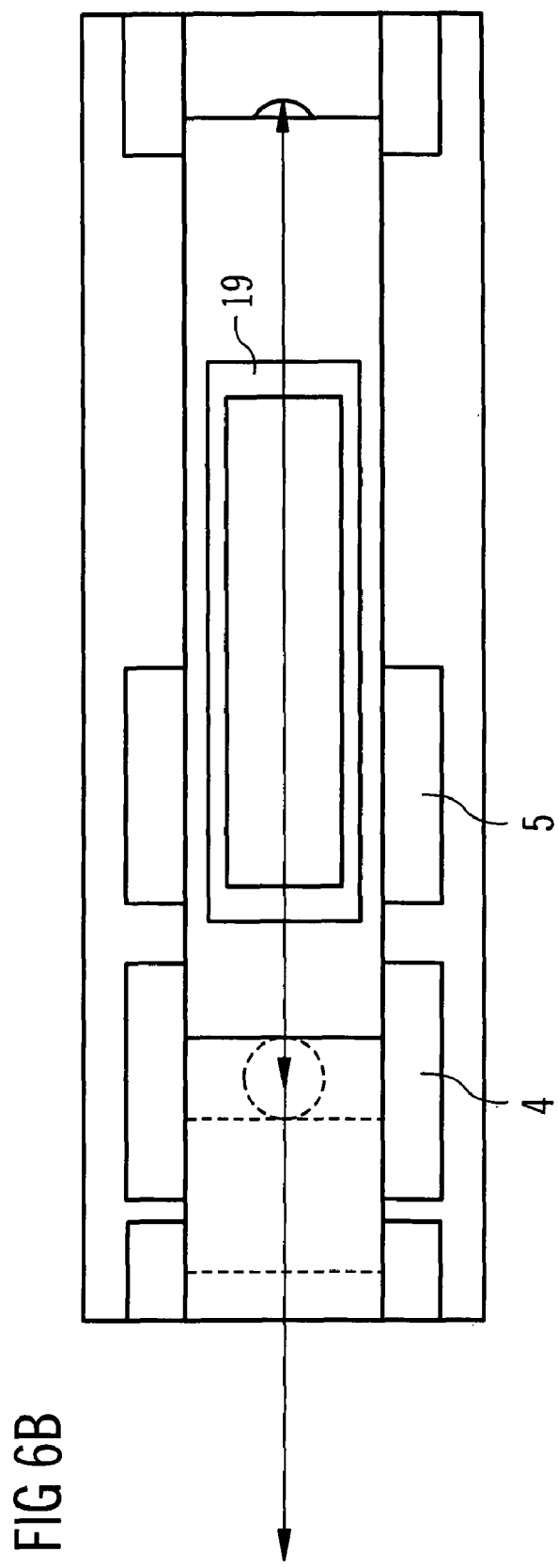
FIG 6A
FIG 6B

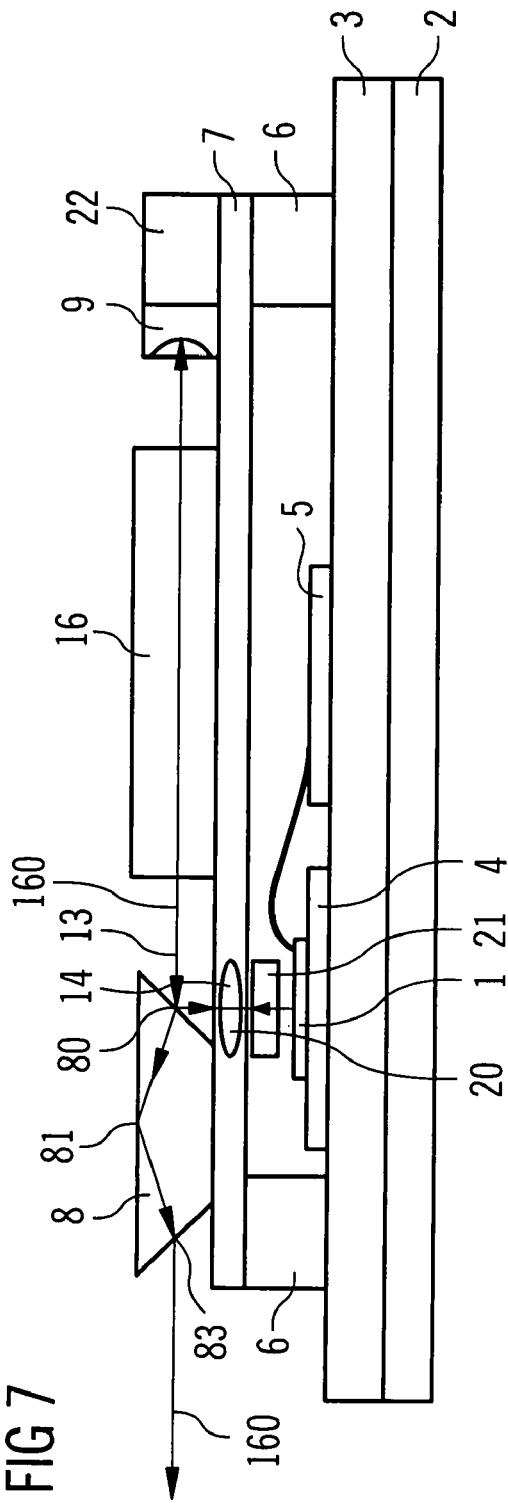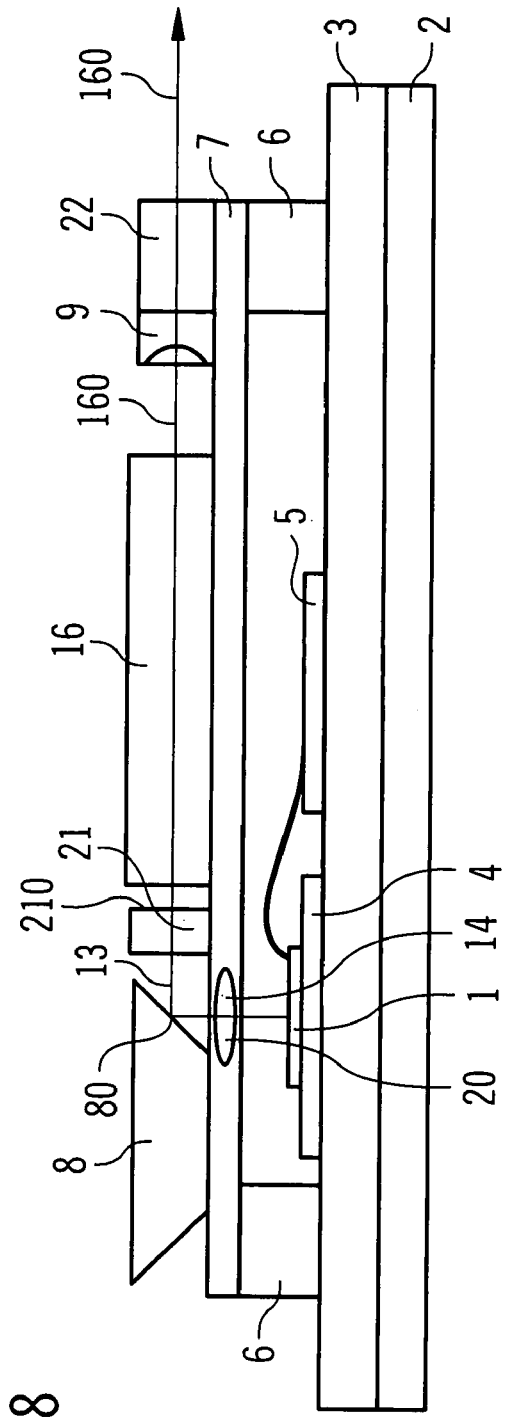

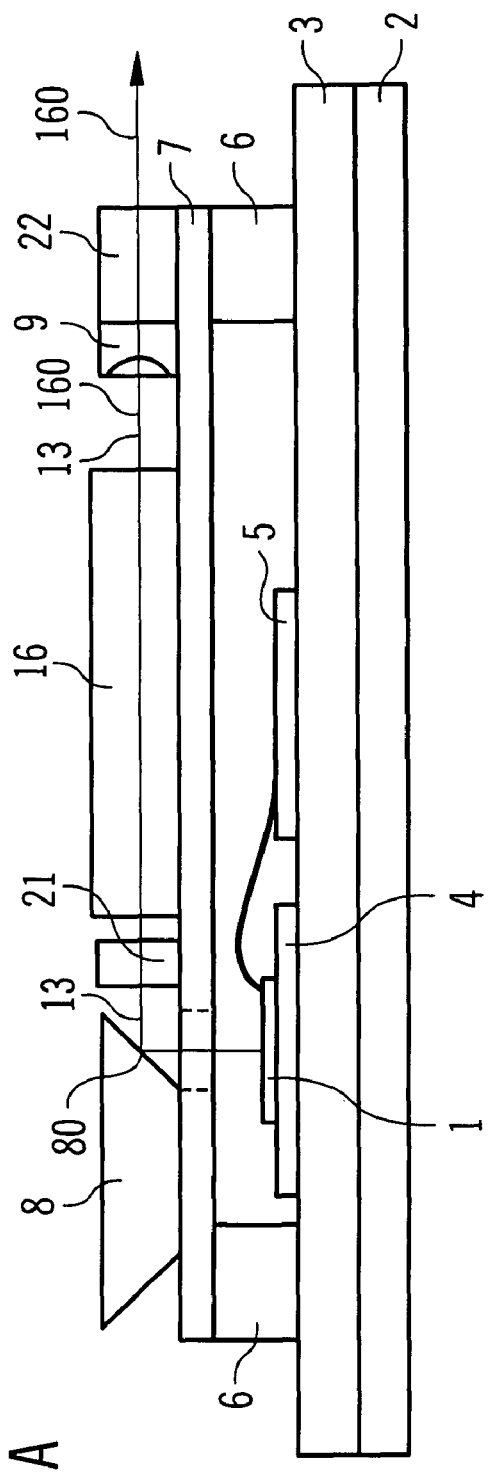
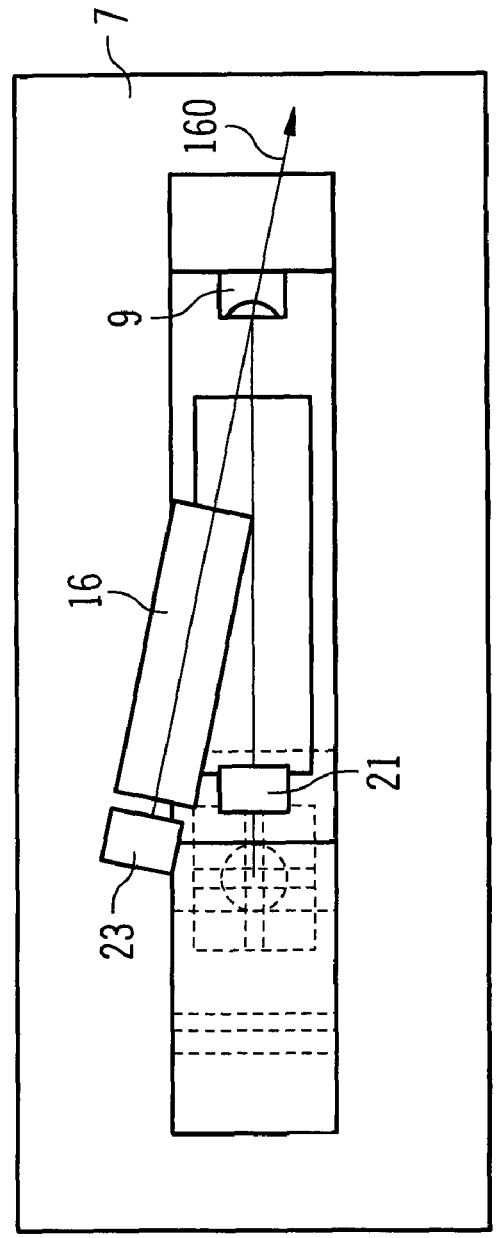
FIG 9A
FIG 9B

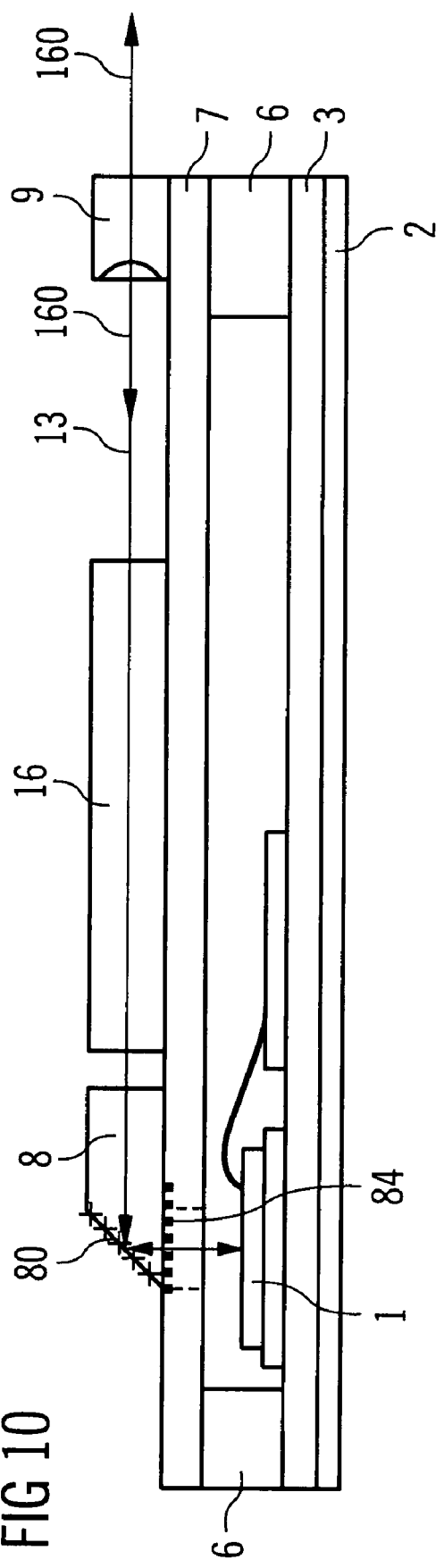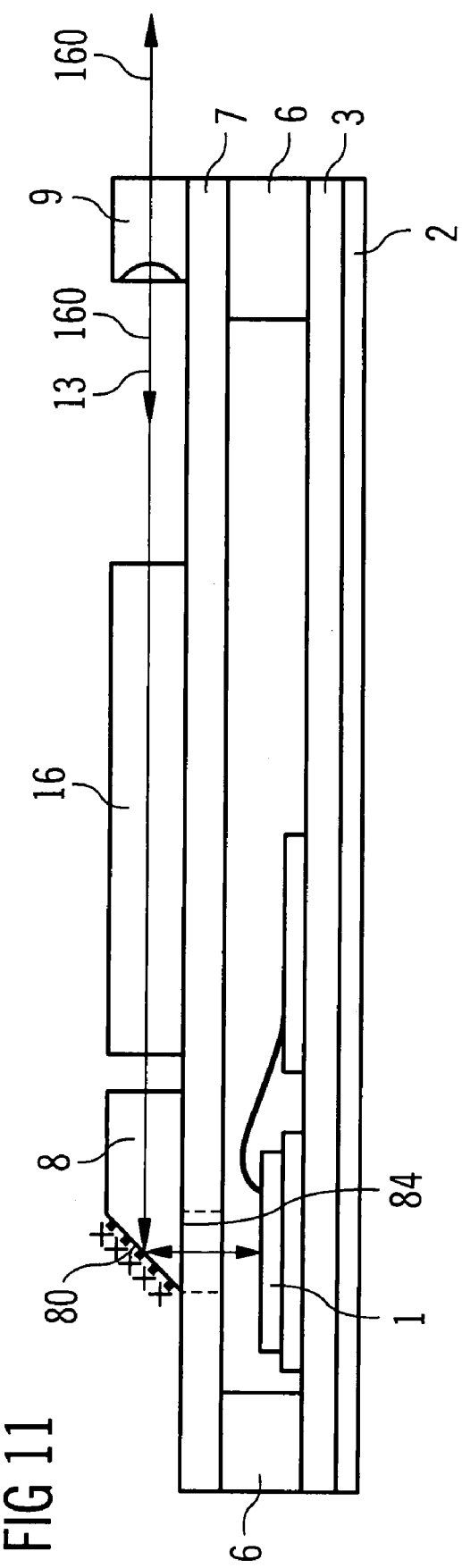

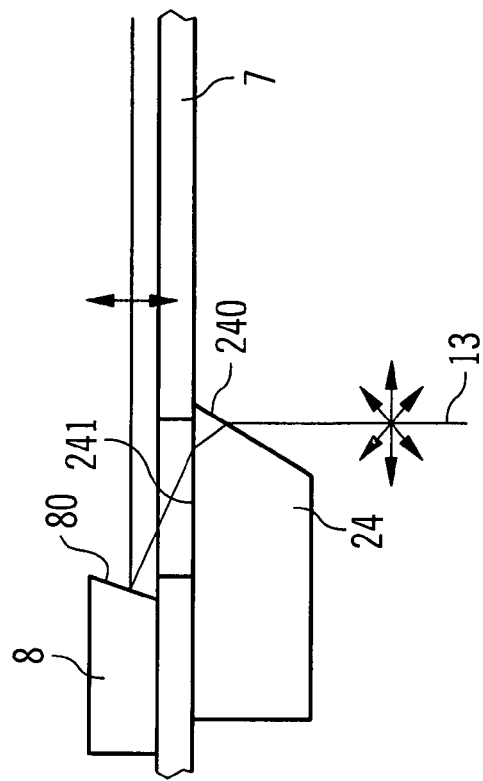
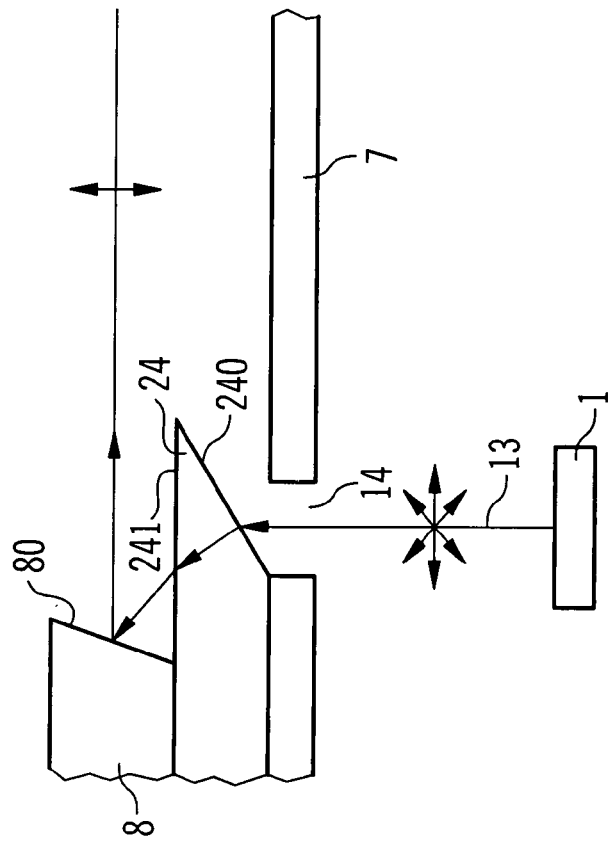

SEMICONDUCTOR LASER COMPONENT, OPTICAL DEVICE FOR A SEMICONDUCTOR LASER COMPONENT, AND METHOD FOR PRODUCING AN OPTICAL DEVICE

RELATED APPLICATION

This is a U.S. national stage of application No. PCT/DE2005/001122, filed on Jun. 24, 2005.

This patent application claims the priority of German patent application no. 10 2004 037 019.2 filed Jul. 30, 2004 and 10 2004 050 188.1 filed Oct. 14, 2004, the disclosure content of which is hereby incorporated by reference.

FIELD OF THE INVENTION

The invention relates to a semiconductor laser component comprising a semiconductor laser chip provided for generating radiation and an external mirror for an external optical resonator for the semiconductor laser chip.

BACKGROUND OF THE INVENTION

For an efficient laser activity during operation of a semiconductor laser component with an external resonator, it is often necessary to carry out a complicated spatial alignment of the external mirror with respect to the semiconductor laser chip.

SUMMARY OF THE INVENTION

It is an object of the invention to provide a semiconductor laser component comprising a semiconductor laser chip and an external mirror for an external optical resonator, wherein the external mirror can be aligned with respect to the semiconductor laser chip in a simplified manner.

Another object of the invention to provide an optical device for a semiconductor laser component of this type which facilitates the formation of a particularly small and compact design of a semiconductor laser component.

Yet another object of the invention is to provide a method for producing an optical device.

These and other objects are attained in accordance with one aspect of the present invention directed to a semiconductor laser component that comprises a semiconductor laser chip provided for generating radiation and an optical device comprising a carrier. A radiation deflecting element is arranged on the carrier and a mirror is arranged on the carrier. The mirror is formed as an external mirror of an external optical resonator for the semiconductor laser chip. The radiation deflecting element is arranged within the resonator. The radiation deflecting element is formed for deflecting at least a portion of a radiation that is generated by the semiconductor laser chip and reflected by the external mirror. The carrier has a lateral main extension direction, and the semiconductor laser chip is disposed downstream of the carrier in a vertical direction with respect to the lateral main extension direction.

The alignment of the external mirror for a resonator can advantageously be at least partly shifted into the fabrication of the optical device. In particular, the radiation deflecting element and the external mirror can already be prealigned with respect to one another in a manner corresponding to the resonator. A complicated three-dimensional alignment of the external mirror with respect to the semiconductor laser chip can be converted into an advantageously simplified planar alignment between the optical device and the semiconductor laser chip by means of suitable prealignment of the elements of the optical device.

Preferably, the radiation deflecting element deflects radiation in the resonator in a direction running essentially parallel to the lateral main extension direction of the carrier. Particularly preferably, the radiation deflecting element deflects radiation reflected by the external mirror at least partly toward the semiconductor laser chip which generates the radiation and the latter can be amplified in the resonator to form laser radiation.

The resonator may be folded by means of the radiation deflecting element, the external mirror preferably forming a resonator end mirror. This advantageously facilitates the formation of a small compact design of the semiconductor laser component.

In one preferred configuration of the invention, the radiation deflecting element and/or the external mirror is fixed on the carrier, for example in each case by means of a connection formed by anodic bonding, adhesive bonding or soldering.

In accordance with a further preferred configuration of the invention, the radiation deflecting element and the external mirror are arranged laterally side by side. An arrangement of this type is also referred to hereinafter as "lateral arrangement". Preferably, the radiation deflecting element is in this case formed in such a way that it deflects radiation generated in the semiconductor laser chip in the direction of the external mirror.

In a further preferred configuration of the invention, the external mirror is spaced apart from the carrier in a vertical direction with respect to the lateral main extension direction. Preferably, the radiation deflecting element is arranged between carrier and external mirror for this purpose. An arrangement of this type is also referred to hereinafter as "vertical arrangement".

In accordance with a further preferred configuration of the invention, the semiconductor laser chip is a surface emitting semiconductor laser chip, which preferably has, in contrast to an edge emitting laser, an essentially vertical emission direction with respect to the surface of the semiconductor laser chip. By way of example, the semiconductor laser chip is formed as a VECSEL (Vertical External Cavity Surface Emitting Laser) or a semiconductor disk laser. Preferably, the optical device is formed in such a way that the radiation deflecting element deflects the radiation emitted, in particular vertically, by the semiconductor laser chip in a direction essentially parallel to the lateral main extension direction of the carrier toward the external mirror.

The semiconductor laser chip may be optically pumped by means of one or more pump radiation sources for generating radiation in an active region. The wavelength of the pump radiation is expediently lower than that of the radiation emitted by the semiconductor laser chip. Preferably, the semiconductor laser chip is optically pumped laterally—essentially parallel to the emission surface of the semiconductor laser chip. A pump radiation source formed as an edge emitting semiconductor laser is particularly suitable for optically pumping the semiconductor laser chip.

In one preferred configuration of the invention, the pump radiation source(s) and an active region of the semiconductor laser chip which is to be pumped are monolithically integrated into the semiconductor laser chip. In this case, structures that define the semiconductor laser chip and the pump radiation sources are produced on a common growth substrate by means of epitaxy. By way of example, firstly a layer structure comprising the active region to be pumped is grown on the growth substrate and is subsequently removed from the growth substrate in regions, it being possible for the pump radiation source to be grown on the growth substrate in the removed regions. The active region of the semiconductor laser chip may be arranged for example within or outside a resonator of the pump radiation source.

If appropriate, the semiconductor laser chip may also be optically pumped by means of an external pump radiation source not integrated in the semiconductor laser chip, for instance an external laser. A pump radiation impinging on the semiconductor laser chip at an angle of approximately 45° with respect to the emission surface has been found to be particularly suitable.

In a further preferred configuration of the invention, the carrier is spaced apart from the semiconductor laser chip by means of at least one spacer element, preferably a plurality of spacer elements. A spacer element may advantageously be fixed to the carrier or formed in the carrier prior to the mounting or alignment of the optical device. The spacer element may contain for example a glass, silicon or a ceramic.

By way of example, anodic bonding, adhesive bonding or soldering are suitable for fixing a spacer element to the carrier. If a spacer element is formed in the carrier, this may be effected by means of corresponding structuring of the carrier. By way of example, the carrier contains a glass or a semiconductor material, for instance Si or else GaAs.

By way of example, sandblasting methods, in particular for glasses, or etching methods, in particular for semiconductor materials, such as Si, are particularly suitable for structuring spacer elements. Furthermore, a spacer element may be structured by means of sawing from the carrier. If appropriate, the spacer element is additionally treated by means of grinding and/or polishing after the structuring operation. Methods of this type make it possible to form a cavity for the semiconductor laser chip in the carrier, the wall of the cavity forming the spacer element.

In one advantageous development of the invention, the optical device is formed as a housing part for a housing of the semiconductor laser component. The semiconductor laser chip is advantageously protected against harmful external influences by the housing.

In a further preferred configuration of the invention, the semiconductor laser chip is premounted on a chip carrier, which comprises for instance a heat sink and/or connections for making electrical contact with the semiconductor laser chip or the pump radiation source, and the optical device is disposed downstream of the semiconductor laser chip after the premounting. Preferably, the optical device is fixed on the chip carrier by means of a bonding connection, an adhesive connection, or a soldering connection. Particularly preferably, the optical device is fixed on the chip carrier via the spacer element(s). A DBC substrate (Direct Bond Copper) is particularly suitable as chip carrier.

In a further preferred configuration of the invention, the radiation deflecting element and the external mirror are arranged on that side of the carrier which faces the semiconductor laser chip. As a result of this, the distance between semiconductor laser chip and radiation deflecting element can be kept advantageously small and the formation of an advantageously compact and small design of the semiconductor laser component is consequently facilitated.

In accordance with a further preferred configuration of the invention, the radiation deflecting element and the external mirror are arranged on that side of the carrier which is remote from the semiconductor laser chip. Preferably, the radiation generated in the semiconductor laser chip radiates through the carrier in this case. For this purpose, the carrier may have for example a cutout, for instance a hole or a gap, which is correspondingly arranged over the semiconductor laser chip and may be introduced into the carrier for example by means of etching, waterjet cutting or drilling. The accessibility of the resonator from the outside is facilitated by such an arrangement of external mirror and radiation deflecting element.

In a further preferred configuration of the invention, a nonlinear optical element for frequency conversion, preferably for frequency multiplication, is arranged in the resonator. The nonlinear optical element is preferably arranged on the carrier or fixed on the carrier, for example by means of soldering or adhesive bonding. A small, compact design of the semiconductor laser component with a nonlinear optical element is more extensively promoted by means of an arrangement of the nonlinear optical element in the resonator and/or on the carrier.

The nonlinear optical element is preferably formed for frequency conversion of radiation in the resonator. By way of example, the nonlinear optical element may be formed for frequency doubling (SHG: Second Harmonic Generation). Preferably, the nonlinear optical element may serve for the frequency conversion of non-visible, for instance infrared, radiation into visible radiation. Non-visible, in particular infrared, radiation can be generated particularly efficiently by means of AlGaAs- or GaAs-based semiconductor laser components with an external resonator.

In one advantageous development of the invention, the nonlinear optical element is arranged between the external mirror and the carrier. This arrangement is expedient particularly for the vertical arrangement. In this case, the nonlinear optical element is particularly preferably arranged between the external mirror and the radiation deflecting element and/or the external mirror is spaced apart from the carrier by means of the nonlinear optical element.

In a further preferred configuration of the invention, the nonlinear optical element is arranged between the external mirror and the radiation deflecting element. Radiation deflected from the radiation deflecting element toward the external mirror can thus be frequency-converted in the nonlinear optical element in the same way as radiation reflected by the external mirror. For the lateral arrangement, the nonlinear optical element is expediently spaced apart from the radiation deflecting element in a lateral direction.

In one advantageous development of the invention, the nonlinear optical element is heatable and/or temperature-stabilizable by means of a temperature regulating element, which is preferably formed as a heating resistor. The temperature regulating element is preferably integrated in the carrier. If the carrier contains a semiconductor material, a heating resistor may be embodied as a pn junction integrated in the semiconductor material. The risk of temperature-dictated fluctuations in the refractive index of the nonlinear optical element can be reduced by means of a temperature regulating element. Consequently, the frequency of the frequency-converted radiation can advantageously be stabilized.

In a further preferred configuration of the invention, the radiation deflecting element or the external mirror is formed for radiation coupling out of radiation, preferably frequency-converted radiation, from the resonator. For this purpose, the radiation deflecting element or the external mirror may correspondingly be formed in highly reflective fashion or highly transmissive fashion for the radiation to be coupled out. By way of example, this may be achieved by means of corresponding coatings of surfaces of the external mirror or of the radiation deflecting element, for instance metal-containing and/or dielectric coatings.

In one advantageous development of the invention, the radiation coupling out from the resonator by means of the radiation deflecting element is effected under total internal reflection in the radiation deflecting element.

The radiation deflecting element may be formed as a prism or beam splitter, preferably a dichroic beam splitter. For example, the radiation deflecting element contains a glass.

If appropriate, further elements, such as an optical element for beam shaping, for instance a lens, an element for polarization selection, for instance a Brewster element, or an element for wavelength selection, for instance a wavelength filter, a wavelength-selective coating or a dispersive element, may also be arranged in the resonator.

By means of a lens or a further folding of the resonator by means of a, preferably curved, folding mirror, it is possible to obtain an advantageously small beam waist of the radiation in the resonator.

Elements of this type may advantageously be arranged and/or fixed at the carrier. A further folding of the resonator, in addition to a folding at the radiation deflecting element, is preferably effected essentially parallel to the lateral main extension direction of the carrier.

Another aspect of the invention is directed to a method according to the invention for producing an optical device provided as a resonator attachment for a semiconductor laser component of the abovementioned type. Firstly, a carrier is provided. Afterwards, a radiation deflecting element and an external mirror are arranged on the carrier. The optical device is thereupon completed.

In one embodiment of the invention, the radiation deflecting element and the external mirror are aligned with respect to one another.

The radiation deflecting element and the external mirror are preferably fixed on the carrier by means of anodic bonding.

A nonlinear optical element may be arranged and/or fixed on the carrier between the radiation deflecting element and the external mirror. For example, the nonlinear optical element is adhesively bonded or soldered onto the carrier.

In one preferred configuration of the method, the method is designed for simultaneously producing a plurality of optical devices.

For this purpose, in accordance with one advantageous development of the invention, firstly a carrier layer is provided, for instance in disk form, on which a radiation deflecting strip provided for forming a plurality of radiation deflecting elements and a mirror strip provided for forming a plurality of external mirrors are arranged and preferably fixed. Radiation deflecting strip and mirror strip are aligned with respect to one another, preferably prior to fixing, on the carrier layer in a manner corresponding to an optical resonator. The assembly comprising carrier layer, radiation deflecting strip and mirror strip may subsequently be singulated into a plurality of optical devices comprising a radiation deflecting element and an external mirror. In the course of singulation, the carrier of the optical device is formed from the carrier layer, the radiation deflecting element is formed from the radiation deflecting strip and the external mirror is formed from the mirror strip.

Nonlinear optical elements may likewise be arranged and/or fixed in the form of a strip or as individual elements on the carrier layer in the assembly or as individual elements on the carrier after singulation.

Another aspect of the invention is directed to an optical device that comprises a carrier, a radiation deflecting element arranged on the carrier and a mirror arranged on the carrier, wherein the optical device is provided as a resonator attachment for a semiconductor laser component.

An optical device of this type, provided as an attachment for a semiconductor laser chip that is preferably premounted on a chip carrier, advantageously increases the number of variation possibilities with regard to the formation of the resonator or a frequency conversion for semiconductor laser chips of identical type. The semiconductor laser chips can be premounted on chip carriers in efficient automated processes, whereupon a respectively individualized optical device can be arranged and/or fixed as a resonator attachment on the chip carrier. In particular, semiconductor laser components having different wavelengths of the emitted radiation, depending on the respective nonlinear optical element, can be formed with semiconductor laser chips of identical type.

The features described further above in connection with the semiconductor laser component according to the invention also relate to the method according to the invention or the optical device according to the invention, or vice versa, since the optical device is preferably provided for a semiconductor laser component of this type or is produced according to the method.

BRIEF DESCRIPTION OF THE DRAWINGS

A first exemplary embodiment of a semiconductor laser component according to the invention is shown in a schematic sectional view in FIG. 1A and in a schematic plan view in FIG. 1B, A second exemplary embodiment of a semiconductor laser component according to the invention is shown in a schematic sectional view in FIG. 2A and in a schematic plan view in FIG. 2B, A third exemplary embodiment of a semiconductor laser component according to the invention is shown in a schematic sectional view in FIG. 3A and in a schematic plan view in FIG. 3B, A fourth exemplary embodiment of a semiconductor laser component according to the invention is shown in a schematic sectional view in FIG. 4A and in a schematic plan view in FIG. 4B, A fifth exemplary embodiment of a semiconductor laser component according to the invention is shown in a schematic sectional view in FIG. 5A and in a schematic plan view in FIG. 5B, A sixth exemplary embodiment of a semiconductor laser component according to the invention is shown in a schematic sectional view in FIG. 6A and in a schematic plan view in FIG. 6B, FIG. 7 shows a schematic sectional view of a seventh exemplary embodiment of a semiconductor laser component according to the invention, FIG. 8 shows a schematic sectional view of an eighth exemplary embodiment of a semiconductor laser component according to the invention, A ninth exemplary embodiment of a semiconductor laser component according to the invention is shown in a schematic sectional view in FIG. 9A and in a schematic plan view in FIG. 9B, FIG. 10 shows a schematic sectional view of a tenth exemplary embodiment of a semiconductor laser component according to the invention, FIG. 11 shows a schematic sectional view of an eleventh exemplary embodiment of a semiconductor laser component according to the invention.

DETAILED DESCRIPTION OF THE DRAWINGS

Figure 3A:
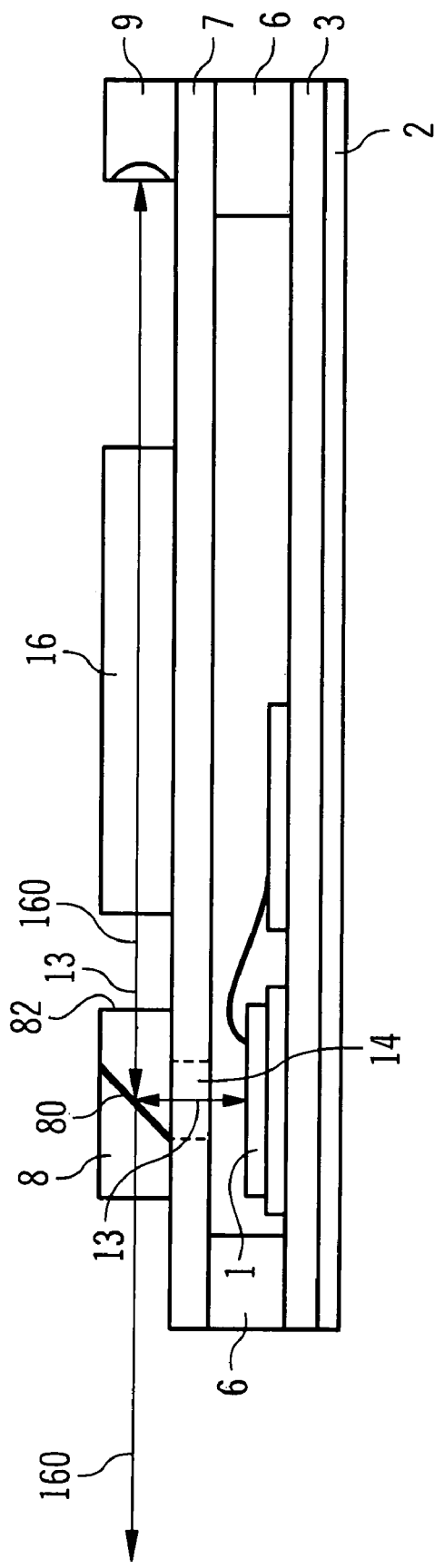

Elements that are identical, of identical type and act identically are provided with the same reference symbols in the Figures.

A first exemplary embodiment of a semiconductor laser component according to the invention is shown in a sectional view in FIG. 1A and in a plan view in FIG. 1B.

A semiconductor laser chip 1 is arranged on a chip carrier comprising a heat sink 2, an electrical insulation layer 3 and also a first connection 4 and a second connection 5.

An optical device comprising a carrier 7, a radiation deflecting element 8 arranged on that side of the carrier which is remote from the semiconductor laser chip 1, and an external mirror 9 arranged on the same side of the carrier is disposed downstream of the semiconductor laser chip 1 in a vertical direction and is spaced apart from the semiconductor laser chip by means of spacer elements 6.

A pumped active region is monolithically integrated in the semiconductor laser chip 1 together with one or more pump radiation sources, for instance edge emitting lasers, which optically pump the semiconductor laser chip 1 laterally. For making electrical contact with the pump radiation source(s), a bonding wire 11 is electrically conductively connected to the second connection 5 and the semiconductor laser chip is fixed on and electrically conductively connected to the first connection 4 for example by means of a solder connection, for instance by means of a hard solder, the solder connection serving both for fixing and for the electrically conductive connection. The semiconductor laser chip 1 is premounted on the chip carrier.

The connections 4, 5 contain copper, for example, and/or ensure sufficient heat dissipation of the heat generated at the semiconductor laser chip during operation via the insulation layer, which contains for example a ceramic, for instance aluminum nitride, to the heat sink 2. Aluminum nitride is distinguished by an advantageously high thermal conductivity. The heat sink 2 contains copper, for example. The chip carrier is thus preferably embodied as a DBC substrate (DBC: Direct Bond Copper).

The spacer elements 6 may contain or comprise a glass or silicon, for example, in the same way as the carrier 7. The spacer elements, preferably prior to the arrangement of the optical device on the chip carrier, are premounted at the carrier or shaped by structuring of the carrier. By way of example, spacer elements made of glass which are fixed to the carrier by means of anodic bonding, adhesive bonding or soldering are suitable for premounting. Sawing with subsequent grinding and polishing of the corresponding surfaces of the spacer elements is particularly suitable for the structuring of the spacer elements from the carrier.

The radiation deflecting element and/or the external mirror is anodically bonded, adhesively bonded or soldered onto the carrier. The optical device is preferably fixed on the chip carrier via the spacer elements. Adhesive bonding or soldering, for example, is suitable for this purpose.

The radiation 13 that is generated in the semiconductor laser chip 1 by means of optical pumping of an active region of the semiconductor laser chip and is emitted vertically with respect to the surface 12 of the semiconductor laser chip is deflected by means of the radiation deflecting element 8, after passing through a cutout 14 in the carrier 7, toward the external mirror 9. The cutout may for example be etched or drilled into the carrier and is preferably embodied as a gap or in essentially circular fashion in plan view as shown in FIG. 1B.

The radiation deflecting element 8 is formed here as a glass prism provided, for example on the part of a reflector area 80, with a highly reflective coating, for instance a metallic or dielectric coating, for the radiation emitted by the semiconductor laser chip.

In one preferred configuration of the invention, the external mirror delimits, together with a further mirror, which is preferably formed as a Bragg mirror integrated in the semiconductor laser chip, the optical resonator of the semiconductor laser component. The Bragg mirror preferably has a reflectivity of 99.9%.

In the exemplary embodiment in accordance with FIGS. 1A and 1B, the external mirror is formed as a coupling-out mirror for coupling out laser radiation from the resonator and for this purpose has for example a reflectivity of 96% or more. Preferably, the mirror is embodied in concavely curved fashion. Preferably, given a spherical curvature, the radius of curvature of the mirror is 20 mm, particularly preferably 10 mm, or less, whereby the beam radius of the radiation in the resonator can be kept advantageously small.

Radiation generated in the semiconductor laser chip is amplified by means of induced emission in the active region of the semiconductor laser chip and partly coupled out via the external mirror 9. By way of the radius of curvature of the external mirror and the optical path length in the resonator, it is possible to adapt the beam radius in the resonator to the size of the active region. Through suitable adaptation of the beam radius, it is possible, if appropriate, to force a fundamental mode operation of the semiconductor laser component, for example by setting the beam cross-sectional area to be greater than the active region in a suitable manner. Since radiation portions are not amplified outside of the active region, higher modes can thus only build up oscillations in correspondingly reduced fashion.

The radiation deflecting element 8 deflects the radiation incident on the radiation deflecting element from the semiconductor laser chip preferably in a direction parallel to a main surface 15 of the carrier toward the external mirror 9.

In a further preferred configuration of the invention, carrier and semiconductor laser chip are arranged relative to one another in such a way that the radiation emitted vertically by the semiconductor laser chip is radiated essentially perpendicular to the lateral main extension direction or main surface of the carrier and is deflected by the radiation deflecting element in a direction parallel to the main surface, preferably parallel to the main extension direction, of the carrier. Preferably, for this purpose the surface 12 of the semiconductor laser chip and the carrier are arranged essentially parallel to one another. Particularly preferably, the main surface 15 of the carrier 7 is essentially parallel to the surface 12 of the semiconductor laser chip 1 and/or the semiconductor laser chip 1 is premounted on the chip carrier in such a way that the surface 12 runs essentially parallel to the chip carrier.

Furthermore, the radiation deflecting element deflects the incident radiation preferably by an angle of 90° and for this purpose is formed for example in such a way that the reflector area 80 forms an angle of approximately 45° with the main surface 15 of the carrier.

The formation of a compact design of the semiconductor laser component and the resonator is facilitated by means of the folding of the resonator at the radiation deflecting element 8.

Since the optical device is preferably present in prefabricated fashion and radiation deflecting element and external mirror are already coordinated with respect to one another in a manner commensurate with the resonator, it is necessary to align the external mirror for the optical resonator only with respect to the semiconductor laser chip. The optical device can be placed as a resonator attachment on a premounted semiconductor laser chip and be fixed on the chip carrier. An alignment of the external mirror relative to the semiconductor laser chip can advantageously be effected in the mounting plane of the optical device, preferably the plane of the chip carrier. A complicated three-dimensional spatial alignment of the mirror can advantageously be dispensed with.

In a further preferred configuration of the invention, the semiconductor laser chip is formed in accordance with a semiconductor disk laser or VECSEL. The wavelength of the radiation generated in the semiconductor laser chip particularly preferably lies in the infrared spectral range, for example between and including 900 nm and including 1100 nm, and may be for instance 920 nm, 1000 nm or 1040 nm. For this purpose, the semiconductor laser chip is preferably based on GaAs or AlGaAs.

In one advantageous development of the invention, the semiconductor laser chip contains or is based on a III-V semiconductor material system, for instance $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$. Materials from the material system $In_xGa_yAl_{1-x-y}As$ are particularly suitable for efficient generation of radiation in the infrared spectral range.

A second exemplary embodiment of a semiconductor laser component according to the invention is shown in a sectional view in FIG. 2A and in a plan view in FIG. 2B.

This exemplary embodiment essentially corresponds to the exemplary embodiment shown in FIGS. 1A and 1B. In contrast thereto, in accordance with FIGS. 2A and 2B, a nonlinear optical element 16 for frequency conversion is arranged in the optical resonator and the coupling out is effected through the radiation deflecting element.

Radiation 13 that is generated or amplified in the semiconductor laser chip impinges on the radiation deflecting element 8, which is formed such that it is highly reflective for the radiation 13, for instance by means of corresponding coating of the reflector area 80, is deflected at the reflector area 80 and passes through the nonlinear optical element 16, in which a part of the radiation 13 is converted into frequency-converted radiation 160. After passing through the nonlinear optical element, the non-converted radiation 13 and the frequency-converted radiation 160 impinge on the external mirror 9, which is preferably formed such that it is highly reflective for both radiations 13, 160—for example with a reflectivity of 99.9% or more—and in contrast to FIG. 1 is not formed for coupling out. At the external mirror 9, the radiation 13 and the frequency-converted radiation 160 are reflected back in the direction of the radiation deflecting element and pass through the nonlinear optical element a further time, a further component of the radiation 13 being frequency-converted.

After once again passing through the nonlinear optical element 16, the radiation 13 and the converted radiation 160 impinge on the radiation deflecting element 8, which is formed such that it is highly reflective for the radiation 13 and highly transmissive for the frequency-converted radiation 160. For this purpose, the reflector area 80 is preferably coated correspondingly. The radiation 13 is thus fed to the semiconductor laser chip 1 for further amplification and the frequency-converted radiation 160 is coupled out from the resonator via the radiation deflecting element. Preferably, the frequency-converted radiation is coupled out in such a way that it is radiated essentially parallel to the main extension direction of the carrier.

In this case, the radiation deflecting element is embodied as a prism. During the radiation coupling out, the radiation 160 is subjected to total internal reflection at the surface 81 of the radiation deflecting element that is remote from the carrier, and is coupled out from the resonator on that side of the radiation deflecting element which is remote from the nonlinear optical element. The radiation deflecting element is preferably polished correspondingly smoothly for efficient total reflection on the part of the surface 81.

The nonlinear optical element 16 is formed for example for frequency doubling (SHG) of the radiation amplified in the semiconductor laser chip. By way of example, the nonlinear optical element generates green or blue radiation from infrared radiation. Radiation having the wavelength 920 nm can be converted for instance into radiation having a wavelength of 460 nm. Preferably, the nonlinear optical element is fixed on the carrier, for example by means of adhesive bonding or soldering.

A nonlinear optical element that is suitable for frequency doubling, in particular for generating blue or green light, may comprise for example a nonlinear crystal, for instance an LBO (e.g. lithium triborate) or a BiBO (e.g. bismuth triborate) crystal.

The nonlinear optical element may furthermore have periodically poled (PP) quasi phase-matched (QPM: quasi phase matching) structures, for instance PP—KTP (e.g. $KTiOPO_4$), PP-LN (e.g. $PP-LiNbO_3$) or PP-LT (e.g. $PP-LiTaO_3$).

PP-QPM structures may, if appropriate, also be used in MgO-doped or further stoichiometric material variants different from those cited above. In particular, it is also possible to use stoichiometric material variants deviating from those cited above, for instance variants deviating from $LiNbO_3$ and $LiTaO_3$.

By using QPM materials, it is possible advantageously to reduce birefringence-dictated effects such as, for example, a walk-off (deviation of the exit direction of frequency-converted radiation from the nonlinear optical element from the entrance direction of the radiation into the element).

QPM materials are furthermore distinguished by high efficiency in the frequency conversion even in the case of a comparatively high beam waist of the radiation in the nonlinear optical element. In the frequency conversion in crystals, the efficiency is often greatly influenced by the beam waist and usually decreases as the beam waist increases. In order to increase the efficiency in crystals, the radiation to be converted can be focused onto the crystal via an optical element. It is possible to dispense with such focusing, however, in the case of QPM materials owing to the increased material-related efficiency. Furthermore, a plurality of PP-QPM structures can advantageously be produced in a simplified manner simultaneously in the wafer assembly.

By means of suitable periodic poling, such a nonlinear optical element can advantageously be adapted to the specific properties of the semiconductor laser chip in a simplified manner. In particular, the spectral and/or thermal acceptance range of the frequency conversion of such a nonlinear optical element can be adapted to the semiconductor laser chip or the radiation generated by the latter.

If appropriate, it is also possible to use an aperiodically poled QPM structure as nonlinear optical element for frequency conversion. These structures are often distinguished by increased spectral acceptance compared with periodically poled structures, so that the risk of a reduction in the efficiency of the frequency conversion in the nonlinear optical element is not critically increased in the event of slight, for instance temperature-dictated, fluctuations in the frequency of the radiation to the converted.

Figure 3B:
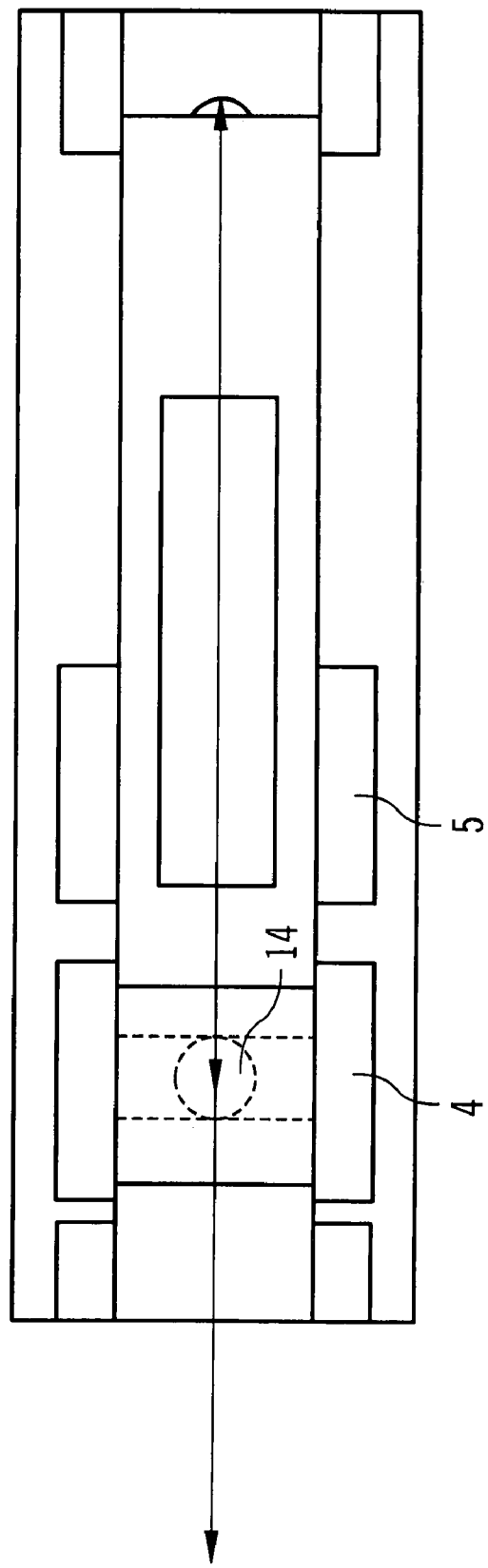

In contrast to FIGS. 2A and 2B, in the third exemplary embodiment, which is schematically illustrated in a sectional view in FIG. 3A and a plan view in FIG. 3B, the radiation deflecting element 8 is embodied as a beam splitter. The beam splitter is preferably formed as a dichroic beam splitter.

On the part of the surface 82, the beam splitter is preferably coated with an antireflection coating for the radiation 13 and the frequency-converted radiation 160, whereas at the reflector area 80 formed at the coupling area of the beam splitter, the radiation 13 is reflected in the direction of the semiconductor laser chip and the frequency-converted radiation 160 is transmitted. This may be achieved for example by means of correspondingly highly reflective or highly transmissive coatings on the part of the reflector area 80 of the beam splitter. On the part of the surface facing the semiconductor laser chip or the surface opposite the surface 82, the beam splitter is preferably provided with an antireflection coating for the corresponding radiations.

In contrast to the exemplary embodiments shown in FIGS. 1A to 2B, the frequency-converted radiation 160 and the non-frequency-converted radiation 13 radiate through the radiation deflecting element in FIGS. 3A and 3B, the radiation entrance sides being identical but the radiation exit sides being different. Furthermore, the cutout 14 is preferably completely covered by the radiation deflecting element 8.

A fourth exemplary embodiment of a semiconductor laser component according to the invention is illustrated in a sectional view in FIG. 4A and in a plan view in FIG. 4B.

In contrast to FIGS. 3A and 3B, the radiation deflecting element 8, the nonlinear optical element 16 and the external mirror 9 are arranged on that side of the carrier 7 which faces the semiconductor laser chip.

The radiation coupling out from the resonator is effected via the radiation deflecting element 8. The radiation emerges from the semiconductor laser component preferably via that region of the spacer elements 6 in which a window 17 is expediently provided for radiation coupling out.

The arrangement of the resonator elements and of the nonlinear optical element on that side of the carrier which faces the semiconductor laser chip 1 facilitates the formation of a smaller and more compact design compared with the exemplary embodiments illustrated in the previous Figures.

Furthermore, a cutout in the carrier can be dispensed with, thereby advantageously increasing the protection of the semiconductor laser chip against harmful external influences.

The spacer element 6 may contain or comprise for example silicon, a glass or a ceramic. The window 17 is preferably introduced into the spacer element 6 as a cutout by means of drilling, etching or sawing.

The window is preferably formed as a drilled hole, etched-in hole, or sawn-in gap in a spacer element or as an interspace between two adjacent spacer elements.

A fifth exemplary embodiment of a semiconductor laser component according to the invention is schematically illustrated in a sectional view in FIG. 5A and in a plan view in FIG. 5B and differs from the exemplary embodiment illustrated in FIGS. 4A, 4B essentially in that the optical device is formed as a housing part for a housing of the semiconductor laser component.

In this case, the carrier 7 is formed as a housing cover and the spacer elements 6 are formed as a housing wall. The carrier preferably completely spans the semiconductor laser chip and also projects beyond the semiconductor laser chip.

The spacer elements 6 preferably run around the semiconductor laser chip 1 on all sides, as is illustrated in FIG. 5B. This advantageously increases the protection of the semiconductor laser chip against harmful external influences.

In this case, the radiation deflecting element 8, the nonlinear optical element 16 and the external mirror 9 may be arranged on that side of the carrier 7 which faces the semiconductor laser chip, for instance as in FIG. 5A, or on that side of the carrier which is remote from the semiconductor laser chip, for instance according to FIG. 2.

In the former case, radiation is coupled out from the resonator preferably through a window 17, which may be formed in one spacer element or between two spacer elements.

In the latter case, it is possible, e.g. as in FIG. 2, to provide a cutout in the carrier and to couple out radiation from the resonator on the side remote from the semiconductor laser chip.

Gaps which might be present between two spacer elements and which do not serve as windows, such as a gap 18, can be sealed with a sealant, for example an adhesive, for more extensive protection against moisture or dust.

In one preferred configuration of the invention, the spacer elements 6 are structured from the carrier, for example by means of sandblasting or etching. Carrier and spacer elements may thus be formed in a single-pieced structure. The number of gaps between spacer elements can thus be reduced.

The spacer element is preferably formed integrally and in a manner free of gaps. In particular, a cavity for the semiconductor laser chip can be structured into the carrier. It is thereby possible to facilitate an essentially hermetic sealing of the housing, for example against dust or moisture.

The housing of the semiconductor laser component comprises the chip carrier, the spacer elements 6 and the carrier 7, the carrier 7 forming the housing cover, the spacer elements forming the housing wall, and the chip carrier forming the housing bottom of the semiconductor laser component. The lateral extent of the carrier is preferably adapted to that of the chip carrier for the formation as housing cover. The formation of a comparatively planar surface of the semiconductor laser component is thus facilitated.

The sixth exemplary embodiment of a semiconductor laser component according to the invention is schematically illustrated in a sectional view in FIG. 6A and in a plan view in FIG. 6B. It essentially corresponds to the exemplary embodiment illustrated in FIGS. 2A and 2B. In contrast to the exemplary embodiment illustrated in FIGS. 2A and 2B, provision is made of a temperature regulating element 19 for regulating the temperature of the nonlinear optical element. The temperature regulating element 19 is preferably thermally conductively connected to the nonlinear optical element, arranged below the nonlinear optical element and/or directly adjoins the nonlinear optical element.

In the present exemplary embodiment, the temperature regulating element 19 is integrated as a heating resistor in the carrier 7. For this purpose, the carrier expediently contains a semiconductor material, for instance silicon, and the temperature regulating element is embodied, by means of suitable doping, as a pn junction that can be operated as a heating resistor. By way of example, surface regions of the carrier are correspondingly doped for a pn junction.

As an alternative or in addition, provision may be made of an external temperature regulating element which is not integrated in the carrier and which is preferably arranged between the carrier and the nonlinear optical element. A metal thin-film resistor, containing Pt for instance, is particularly suitable for this.

On account of a temperature dependence of the refractive index, temperature fluctuations of the nonlinear optical element can lead to fluctuations in the frequency of the frequency-converted radiation 160. The risk of such fluctuations can be reduced by way of regulating the temperature of the nonlinear optical element by means of the temperature regulating element 19.

The temperature regulating element 19 may be arranged on that side of the carrier which faces the nonlinear optical element, and may also be arranged on that side of the carrier which is remote from the nonlinear optical element. The latter case is advantageous particularly when the nonlinear optical element, for instance as in FIG. 4 or 5, is arranged on that side of the carrier which faces the semiconductor laser chip. Electrical driving of the temperature regulating element during operation of the semiconductor laser component can thus be facilitated.

In one advantageous development of the invention, the distance, in particular the optical path, between semiconductor laser chip and radiation deflecting element, in particular with respect to the reflector area 80, is approximately 2 mm, the distance between the radiation deflecting element and that surface of the nonlinear optical element which faces the radiation deflecting element is 1.0 mm and the distance between that surface of the nonlinear optical element which faces the external mirror and the external mirror is approximately 0.5 mm.

Advantageous extents of the nonlinear optical element are, for example, 4 mm for a crystal having critical phase matching, for instance BiBo, or 3 mm for a PP-QPM structure, for instance PP-LN.

If the end mirror in a resonator of this type is spherically concavely curved with a radius of 20 mm, then approximately the following values result for the beam radius in the resonator:

53 μm at the semiconductor laser chip, 55 μm at the radiation deflecting element, 56 μm at that side of the nonlinear optical element which faces the radiation deflecting element, 62 μm at that surface of the nonlinear optical element which faces the external mirror, and 63 μm at the external mirror.

The seventh exemplary embodiment of a semiconductor laser component according to the invention that is schematically illustrated in FIG. 7 on the basis of a sectional view essentially corresponds to the exemplary embodiment shown in FIGS. 2A and 2B. In contrast thereto, an optical element 20 for beam shaping and a wavelength filter 21 are arranged in the beam path in the resonator. Furthermore, the external mirror 9 is fixed to a mounting element 22.

The optical element 20 is preferably arranged at the carrier 7 and fixed there. By way of example, the optical element is arranged in the beam path in the resonator on that side of the carrier which is remote from the semiconductor laser chip or that side of the carrier which faces said semiconductor laser chip. The optical element is preferably arranged in the cutout 14.

The wavelength filter 21 is arranged on that side of the carrier which faces the semiconductor laser chip 1, and is preferably fixed to the carrier. The optical element 20 is preferably formed for reducing the beam waist of the radiation 13 to be converted. By means of focusing in the region of the nonlinear optical element, it is possible to achieve a particularly efficient frequency conversion in the nonlinear optical element, in particular in a nonlinear birefringent crystal.

The efficiency of the frequency conversion can furthermore be increased by the spectral width of the spectrum of the radiation to be converted, preferably infrared radiation, being reduced by means of the wavelength filter 21.

The optical element may be formed for example as a lens, in particular having a focus, for instance as a conventional converging lens or as a GRIN (GRaded INdex), Fresnel, or diffractive lens.

A principal plane of the lens or of the wavelength filter may be arranged parallel to the lateral main extension direction of the carrier or perpendicular thereto.

The wavelength filter 21 for wavelength selection may be embodied for example as a dielectric filter, as a birefringent filter or as an etalon. As an alternative, a wavelength-selective effect may, if appropriate, also be obtained by means of a corresponding, preferably single-sided and/or dielectric, coating of the optical element 20.

The external mirror 9, as resonator end mirror, is not provided for coupling out radiation and is expediently formed such that it is highly reflective for the radiation 13 and the frequency-converted radiation 160. The radiation deflecting element 8 is formed, on the part of the reflector area 80, such that it is highly transmissive for the frequency-converted radiation 160 and highly reflective for the radiation 13. The optical element 20 and the wavelength filter 21 are preferably formed such that they are highly transmissive for the radiation 13. These reflection and transmission properties can be obtained by means of suitable coatings of the relevant surfaces of the external mirror, of the radiation deflecting element, of the optical element and/or of the wavelength filter.

The external mirror 9 may be embodied for example essentially in plane fashion or in concave fashion. This is schematically illustrated by means of the dashed line at the external mirror 9 which indicates a concave external mirror. A plane embodiment is facilitated by the beam shaping by means of the optical element 20, since the beam radius is kept advantageously small by the optical element and it is possible to dispense with beam shaping by the external mirror.

The eighth exemplary embodiment of a semiconductor laser component according to the invention that is schematically illustrated on the basis of a sectional view in FIG. 8 essentially corresponds to the exemplary embodiment illustrated in FIG. 7. In contrast thereto, the wavelength filter 21 is arranged on that side of the carrier 7 which is remote from the semiconductor laser chip 1. Furthermore, in contrast to FIG. 7, the radiation coupling out is effected through the external mirror 9 rather than through the radiation deflecting element 8.

For this purpose, the external mirror is formed such that it is highly reflective for the radiation 13 and highly transmissive for the radiation 160. The reflector area 80 of the radiation deflecting element 8 is formed such that it is reflective with respect to the radiation 13. A surface of the wavelength filter 21, preferably the surface 210 facing the nonlinear optical element, is formed such that it is highly reflective with respect to the frequency-converted radiation 160 and highly transmissive for the radiation 13, so that the proportion of the frequency-converted radiation 160 coupled out via the external mirror 9 is advantageously increased on account of the reflection at the wavelength filter. The wavelength filter is expediently provided with a reflection coating for the radiation 160 and/or an antireflection coating for the radiation 13.

The ninth exemplary embodiment of a semiconductor laser component according to the invention that is schematically illustrated in a sectional view in FIG. 9A and in a plan view in FIG. 9B essentially corresponds to the exemplary embodiment shown in FIG. 8. In contrast thereto, the optical element 20 for beam shaping is dispensed with.

In this exemplary embodiment, a further folding of the resonator is provided for beam shaping. By this means, it is also possible to obtain a sufficiently small beam radius for efficient frequency conversion in the nonlinear optical element 16.

The external mirror 9 is expediently curved concavely in order to reduce the beam waist and simultaneously formed as a coupling-out mirror and folding mirror. The resonator is bounded by a further external mirror 23, which is preferably arranged on the carrier 7 and/or curved concavely. The nonlinear optical element is arranged in the beam path between the mirrors 9 and 23.

The mirror 23 is expediently formed such that it is highly reflective for the radiations 160 and 13. On account of the further folding of the resonator, the emission direction deviates from the direction of the radiation directed by the radiation deflecting element in the direction of the external mirror 9. The further folding may advantageously be effected essentially in the plane parallel to the carrier 7. Such folding in the plane parallel to the carrier enables the semiconductor laser component to be embodied more compactly and smaller, if appropriate, compared with the exemplary embodiments described further above.

The tenth exemplary embodiment of a semiconductor laser component according to the invention that is schematically illustrated in FIG. 10 on the basis of a sectional view essentially corresponds to the exemplary embodiment illustrated in FIGS. 1A and 1B. In contrast thereto, a nonlinear optical element 16 is provided, and radiation partly passes through the radiation deflecting element prior to reflection at the reflector area 80. The frequency-converted radiation 160 is coupled out from the resonator via the external mirror 9. A wavelength-selective, preferably dielectric, coating, indicated in dotted fashion in FIG. 10, may be applied on a surface 84 of the radiation deflecting element. The reflection at the reflector area 80 can be obtained with total internal reflection or by means of a suitable highly reflective coating. Such a coating is indicated in crossed fashion in FIG. 10.

In contrast thereto, in the eleventh exemplary embodiment of a semiconductor laser component according to the invention that is schematically illustrated in FIG. 11 on the basis of a sectional view, the wavelength-selective coating is applied on the radiation deflecting element 8 on the part of the reflector area 80.

Figure 12:
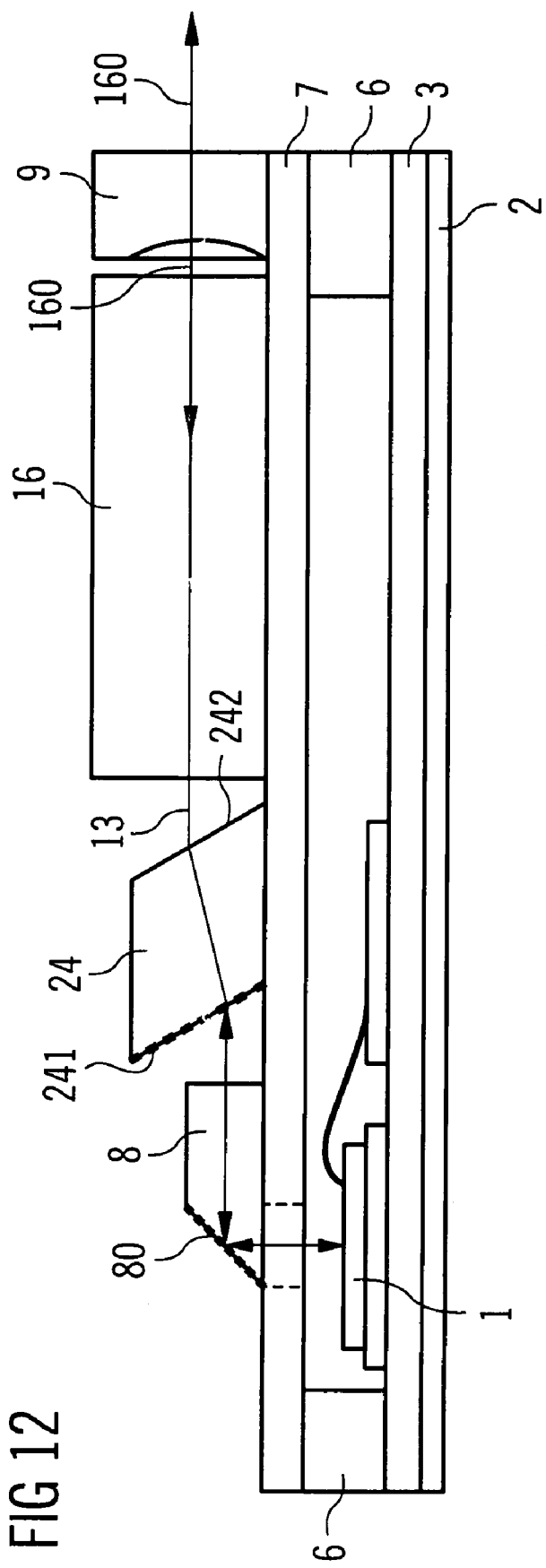
FIG. 12 shows a schematic sectional view of a twelfth exemplary embodiment of a semiconductor laser component according to the invention, A schematic sectional view of part of a thirteenth exemplary embodiment of a semiconductor laser component according to the invention is shown in schematic detail sectional views of one variant in FIG. 13A and in one variant in FIG. 13B.

The twelfth exemplary embodiment of a semiconductor laser component according to the invention that is schematically illustrated in FIG. 12 on the basis of a sectional view essentially corresponds to the exemplary embodiment shown in FIG. 11. In contrast to FIG. 11, a wavelength selection element 24 for wavelength selection, for instance a prism, is arranged on the carrier between radiation deflecting element 8 and nonlinear optical element 16.

A wavelength selection can be obtained for example by means of a corresponding coating of a surface of the wavelength selection element 24 or by dispersion. By way of the wavelength dependence of the refractive index, during the passage of radiation through the wavelength selection element 24 it is possible to increase losses for certain modes in the resonator in such a way that the latter are no longer amplified in the semiconductor laser chip.

A wavelength-selective coating may be provided for example on the light entrance side, as illustrated schematically in FIG. 12 in dotted fashion at the surface 241, and/or at the light exit side on the part of the surface 242, which, is not illustrated in FIG. 12. In this case, light entrance side and light exit side relate to radiation impinging on the wavelength selection element and coming from the radiation deflecting element.

A thirteenth exemplary embodiment of a semiconductor laser component according to the invention is shown in detail by sectional views of a first variant in FIG. 13A and a second variant in FIG. 13B.

In contrast to FIG. 12, the wavelength selection element 24 in FIGS. 13A and 13B is arranged in the beam path of the radiation incident on the radiation deflecting element 8 and coming from the semiconductor laser chip 1. The radiation 13 impinges on the wavelength selection element on the part of the surface 240, is refracted there; passes through the wavelength selection element and is directed in the direction of the radiation deflecting element on the light exit side at the surface 241.

In addition to the wavelength-selective effect by means of the dispersion in the wavelength selection element 24, the wavelength selection element may also be formed for polarization selection. For this purpose, the surface 240 is expediently formed in such a way that the radiation 13 impinges on said surface at least approximately at Brewster's angle. The reflection losses that s-polarized light experiences at the surface 240 are consequently increased compared with p-polarized light. Consequently, p-polarized light is directed in the direction of the radiation deflecting element 8 to an increased extent (s-polarized denotes a linear polarization perpendicular to the plane of incidence and p-polarized denotes a linear polarization parallel to the plane of incidence).

In the variant in accordance with FIG. 13A, the wavelength selection element 24 is arranged on the carrier 7 on the side of the radiation deflecting element, preferably between radiation deflecting element and carrier.

In the variant in accordance with FIG. 13B, the wavelength selection element 24 is fixed on the side of the carrier 7 opposite to the radiation deflecting element and may, for example, completely cover the cutout 14. In the variant in FIG. 13B, too, the wavelength selection element 24 may simultaneously be formed as a polarization selection element.

The polarization state of the radiation in the resonator is schematically indicated by the arrows, in which case an unpolarized state more likely predominates in the case of radiation emitted by the semiconductor laser chip and p-polarization more likely predominates after the impingement of the radiation under Brewster's angle on the wavelength selection element or after passage through the wavelength selection element.

In a further preferred configuration of the invention, the radiation deflecting element has a nonplanar, preferably curved, surface that serves for beam shaping. By way of example, said surface is embodied such that it is spherically, aspherically, concavely or convexly curved and may be produced for example by means of embossing, grinding, etching or impression at the radiation deflecting element. Particularly preferably, the surface is embodied such that it is curved with different radii of curvature, in particular biradially, in order to prevent an astigmatism of the radiation in the resonator. The biradial embodiment has proved to be particularly advantageous in the case of a spherical curvature. An astigmatism occurring at an angle of incidence of 45° can thus be avoided.

If appropriate, in accordance with one advantageous development of the invention, provision may be made of a curved surface for beam shaping and/or for radiation deflection by reflection, possibly with corresponding coating, also at an end face of the nonlinear optical element. In particular, the external mirror may be formed by a corresponding (partly) reflective coating of an end face of the nonlinear optical element.

Figure 14:
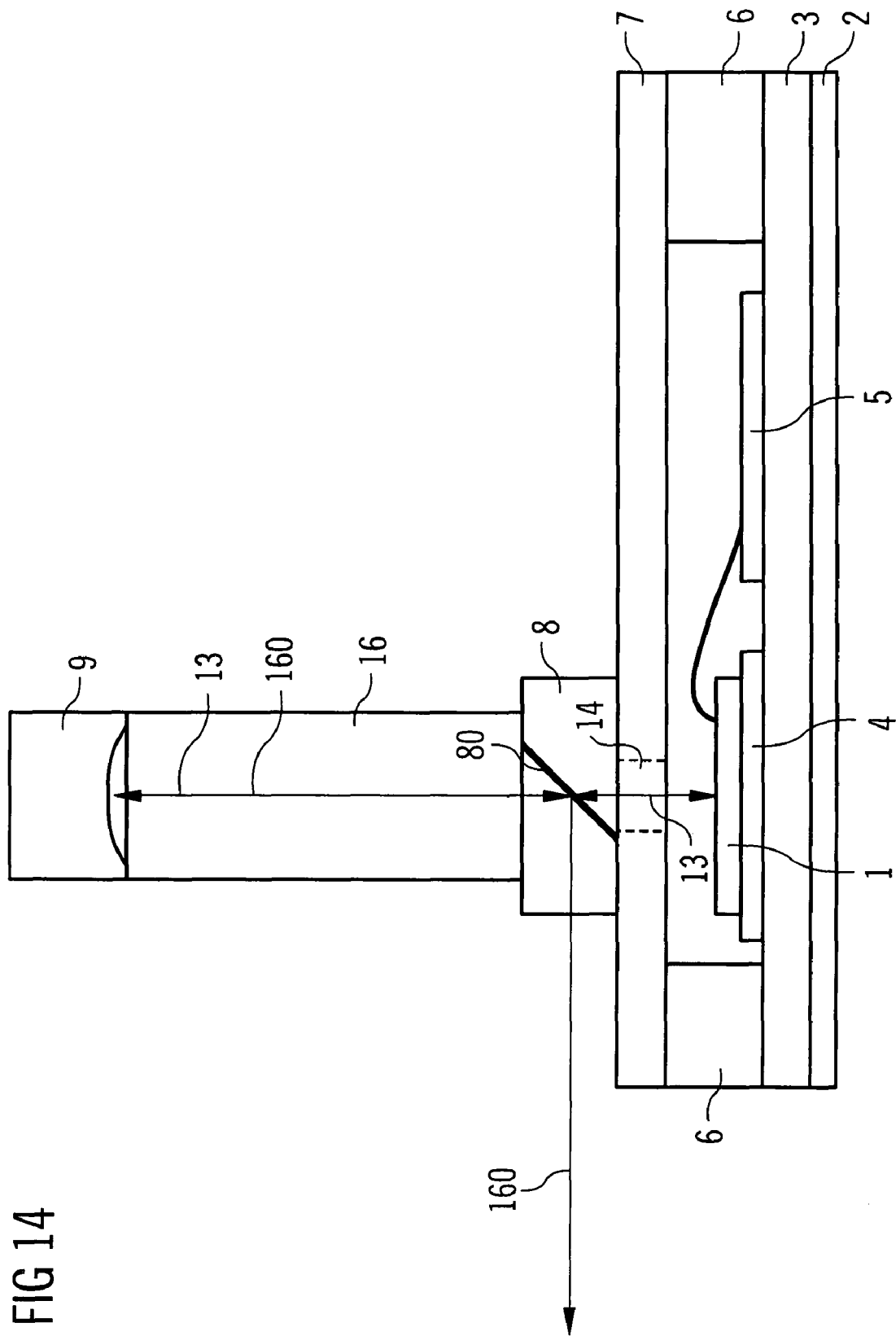
FIG. 14 shows a schematic sectional view of a fourteenth exemplary embodiment of a semiconductor laser component according to the invention, and An exemplary embodiment of a method according to the invention for producing an optical device is illustrated in a schematic sectional view in FIG. 15A and in a schematic plan view in FIG. 15B.

FIG. 14 schematically illustrates a fourteenth exemplary embodiment of a semiconductor laser component according to the invention on the basis of a sectional view.

In contrast to the previous exemplary embodiments, which show essentially lateral arrangements for the optical device, FIG. 14 illustrates an optical device in a vertical arrangement with an external mirror 9 spaced apart vertically from the carrier 7.

The external mirror is spaced apart from the carrier by means of the radiation deflecting element 8, which is preferably embodied as a beam splitter, and the nonlinear optical element 16. Radiation 13 generated in the semiconductor laser chip 1 is radiated through the radiation deflecting element and the nonlinear optical element toward the external mirror 9, frequency-converted radiation 160 and radiation 13 are reflected at the external mirror and, after passing through the nonlinear optical element again, the frequency-converted radiation is coupled out from the resonator by reflection, preferably by approximately 90° with respect to the direction of incidence, at the reflector area 80 and emergence from the radiation deflecting element, preferably essentially parallel to the main extension direction of the carrier 7. The radiation 13 is fed to the semiconductor laser chip 1 for further amplification.

An exemplary embodiment of a production method according to the invention is illustrated in connection with a sectional view in FIG. 15A and in a plan view in FIG. 15B.

Figure 15A:
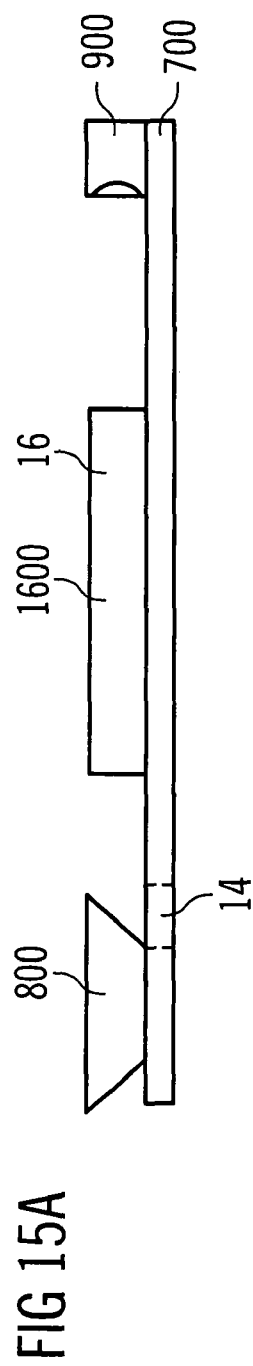
Figure 15B:
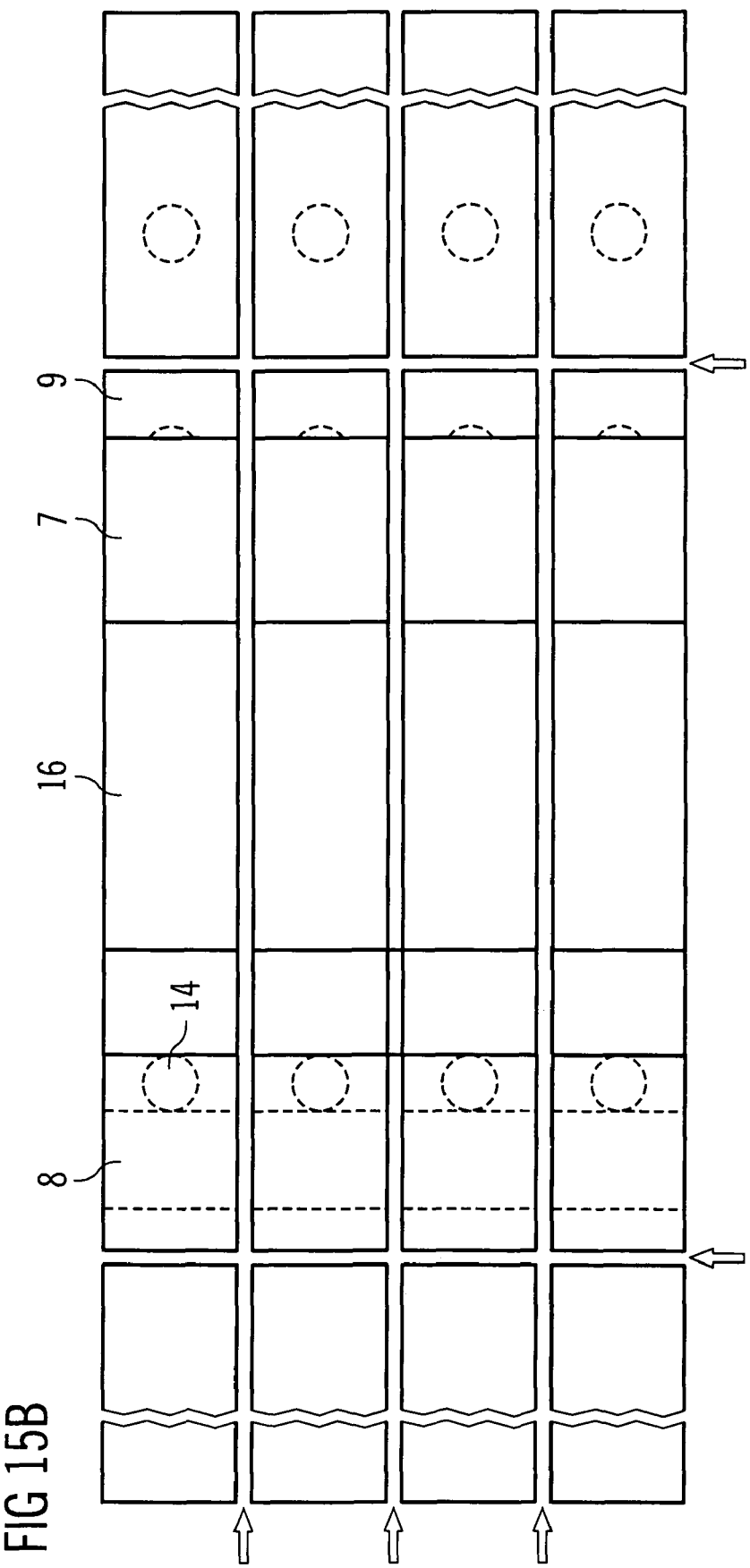

FIGS. 15A and 15B show a method for simultaneously producing a plurality of optical devices. For this purpose, on a carrier layer 700, for instance a 6" silicon wafer, a radiation deflecting strip 800, which is provided for the formation of a plurality of deflecting elements, and a mirror strip 900, which is provided for the formation of a plurality of external mirrors, are arranged on the carrier layer 700 and fixed by means of anodic bonding.

Furthermore, a plurality of cutouts 14 provided for the later optical devices, for instance a drilled hole, a sawn gap or an etched hole, can be introduced into the carrier layer, if appropriate as early as before the mounting of the radiation deflecting strip 800 or the mirror strip 900. In the assembly on the carrier layer, radiation deflecting strip 800 and mirror strip 900 may advantageously already be arranged on the carrier layer 700 and aligned with respect to one another in a manner corresponding to a later optical device. Preferably, the radiation deflecting strip and the mirror strip are aligned with respect to one another in a manner corresponding to the later optical device prior to fixing on the carrier layer. The cutouts are preferably introduced into the carrier layer before the elements are arranged on said carrier layer.

Furthermore, in the method, it is also possible for a nonlinear optical element to be arranged and fixed as strip 1600, provided for the formation of a plurality of nonlinear optical elements, or as an individual nonlinear optical element 16 in accordance with the later optical devices on the carrier layer. By way of example, the nonlinear optical element or the strip can be adhesively bonded or soldered onto the carrier layer. A solder connection makes it possible to achieve a particularly efficient thermal coupling of the nonlinear optical element to a temperature regulating element, which is preferably integrated in the carrier layer.

Spacer elements may be structured from the carrier layer by etching, for instance as mesas from a silicon carrier layer, from the side remote from the radiation deflecting strip and the mirror strip or be fixed as separate elements at the carrier layer.

In order to produce the mirror strip, it is possible for example firstly to prefabricate a two-dimensional areal mirror structure, for instance by corresponding embossing into a substrate, for example made of a glass, and, if appropriate, (partly) reflective coatings. A plurality of mirror strips can subsequently be obtained from the mirror structure.

As illustrated schematically in FIG. 15B on the basis of a plan view, after the fixing of the individual elements, it is possible to effect singulation along the arrows into a plurality of optical devices each comprising a radiation deflecting element 8 and an external mirror 9 and also, if appropriate, a nonlinear optical element 16. By way of example, the singulation may be effected by sawing.

It should be noted that, of course, a plurality of radiation deflecting strips or mirror strips can be arranged on the carrier layer.

Overall, the method facilitates efficient production of a plurality of optical devices.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A semiconductor laser component comprising:
a semiconductor laser chip provided for generating radiation;
an optical device comprising a carrier;
a radiation deflecting element arranged on the carrier; and
a mirror arranged on the carrier,
wherein the mirror is formed as an external mirror of an external optical resonator for the semiconductor laser chip,
wherein the radiation deflecting element is arranged within the resonator,
wherein the radiation deflecting element is formed for deflecting at least a portion of a radiation that is generated by the semiconductor laser chip and reflected by the external mirror,
wherein the carrier has a lateral main extension direction, and
wherein the semiconductor laser chip is spaced apart from the carrier in a direction perpendicular with respect to the lateral main extension direction, and
wherein the optical device comprises a resonator attachment for the semiconductor laser chip.

2. The semiconductor laser component as claimed in claim 1, wherein the radiation deflecting element deflects radiation in the resonator in a direction essentially parallel to the lateral main extension direction of the carrier.

3. The semiconductor laser component as claimed in claim 1, wherein the external mirror forms a resonator end mirror.

4. The semiconductor laser component as claimed in claim 1, wherein the resonator is folded by means of the radiation deflecting element.

5. The semiconductor laser component as claimed in claim 1, wherein at least one of the radiation deflecting element and the external mirror is fixed on the carrier.

6. The semiconductor laser component as claimed in claim 1, wherein the radiation deflecting element is arranged between the carrier and the external mirror.

7. The semiconductor laser component as claimed in claim 1, wherein the radiation deflecting element and the external mirror are arranged laterally side by side.

8. The semiconductor laser component as claimed in claim 1, wherein the semiconductor laser chip is a surface emitting semiconductor laser chip.

9. The semiconductor laser component as claimed in claim 8, wherein the radiation deflecting element deflects the radiation emitted by the semiconductor laser chip essentially parallel to the lateral main extension direction of the carrier toward the external mirror.

10. The semiconductor laser component as claimed in claim 1, wherein the semiconductor laser chip is optically pumped by means of one or more pump radiation sources for generating radiation.

11. The semiconductor laser component as claimed in claim 10, wherein the one or more pump radiation sources and an active region of the semiconductor laser chip which is to be pumped are monolithically integrated into the semiconductor laser chip.

12. The semiconductor laser component as claimed in claim 1, wherein the carrier is spaced apart from the semiconductor laser chip by means of at least one spacer element.

13. The semiconductor laser component as claimed in claim 1, wherein the carrier contains a glass or a semiconductor material.

14. The semiconductor laser component as claimed in claim 1, wherein the optical device is formed as a housing part for a housing of the semiconductor laser component.

15. The semiconductor laser component as claimed in claim 1, wherein the semiconductor laser chip is premounted on a chip carrier and the optical device is at least one of disposed downstream of the semiconductor laser chip and fixed on the chip carrier.

16. The semiconductor laser component as claimed in claim 1, wherein the radiation deflecting element and the external mirror are arranged on a side of the carrier which faces the semiconductor laser chip.

17. The semiconductor laser component as claimed in claim 1, wherein the radiation deflecting element and the external mirror are arranged on a side of the carrier which is remote from the semiconductor laser chip.

18. The semiconductor laser component as claimed in claim 1, wherein a nonlinear optical element for frequency conversion is arranged in the resonator.

19. The semiconductor laser component as claimed in claim 18, wherein the nonlinear optical element is at least one of arranged and fixed on the carrier.

20. The semiconductor laser component as claimed in claim 18, wherein the nonlinear optical element is arranged between the external mirror and the carrier.

21. The semiconductor laser component as claimed in claim 18, wherein the nonlinear optical element is arranged between the external mirror and the radiation deflecting element.

22. The semiconductor laser component as claimed in claim 18, wherein the nonlinear optical element is temperature-regulated by means of a temperature regulating element.

23. The semiconductor laser component as claimed in claim 22, wherein the temperature regulating element is integrated in the carrier.

24. The semiconductor laser component as claimed in claim 1, wherein the radiation deflecting element is formed for the radiation coupling out of radiation from the resonator.

25. The semiconductor laser component as claimed in claim 24, wherein the radiation coupling out from the resonator by the radiation deflecting element is effected under total internal reflection in the radiation deflecting element.

26. The semiconductor laser component as claimed in claim 1, wherein the radiation deflecting element is a prism.

27. The semiconductor laser component as claimed in claim 1, wherein the radiation deflecting element is a beam splitter.

28. A method for producing an optical device provided as a resonator attachment for a semiconductor laser component as claimed in claim 1, comprising:
providing a carrier,
arranging a radiation deflecting element on the carrier,
arranging an external mirror on the carrier, and
completing the optical device.

29. The method as claimed in claim 28, wherein at least one of the radiation deflecting element and the external mirror are fixed on the carrier by means of anodic bonding.

30. The method as claimed in claim 28, wherein a nonlinear optical element is at least one of arranged and fixed on the carrier between the radiation deflecting element and the external mirror.

31. The method as claimed in claim 28, wherein the method is designed for simultaneously producing a plurality of optical devices.

32. The method as claimed in claim 28, further comprising:
aligning the radiation deflecting element and the external mirror with respect to each other on the carrier to form an optical resonator before completing the optical device.

33. The method as claimed in claim 32, further comprising:
after aligning the radiation deflecting element and the external mirror and before completing the optical device, fixing the radiation deflecting element and the external mirror on the carrier.

34. An optical device comprising a carrier, a radiation deflecting element arranged on the carrier and a mirror arranged on the carrier, wherein the optical device is provided as a resonator attachment for a semiconductor laser component.

35. An optical device comprising a carrier, a radiation deflecting element arranged on the carrier and a mirror arranged on the carrier, wherein the optical device is provided as a resonator attachment for a semiconductor laser component, wherein the optical device is formed in accordance with claim 1.

36. The optical device as claimed in claim 34, wherein a non-linear optical element is arranged on the carrier between the radiation deflecting element and the mirror.

* * * * *